United States Patent
Sha et al.

(10) Patent No.: US 7,336,112 B1
(45) Date of Patent: Feb. 26, 2008

(54) FALSE LOCK PROTECTION IN A DELAY-LOCKED LOOP (DLL)

(75) Inventors: I-Teh Sha, Cupertino, CA (US); LiFeng Zhang, Shanghai (CN); HaiTao Sun, Shanghai (CN); JingRong Li, Shanghai (CN)

(73) Assignee: Huaya Microelectronics, Ltd. (KY)

( * ) Notice: Subject to any disclaimer, the term of this patent is extended or adjusted under 35 U.S.C. 154(b) by 0 days.

(21) Appl. No.: 11/466,078

(22) Filed: Aug. 21, 2006

(51) Int. Cl.
*H03L 7/06* (2006.01)

(52) U.S. Cl. ........................... 327/158; 327/157

(58) Field of Classification Search ............ None
See application file for complete search history.

(56) References Cited

U.S. PATENT DOCUMENTS

| | | | | |
|---|---|---|---|---|
| 5,120,990 A | * | 6/1992 | Koker | 327/2 |
| 6,043,677 A | * | 3/2000 | Albu et al. | 326/39 |
| 6,304,116 B1 | * | 10/2001 | Yoon et al. | 327/158 |
| 6,570,420 B1 | * | 5/2003 | Trivedi et al. | 327/156 |
| 6,667,643 B2 | * | 12/2003 | Ko | 327/158 |
| 6,822,483 B1 | | 11/2004 | Fu et al. | |
| 6,844,761 B2 | | 1/2005 | Byun et al. | |
| 6,970,047 B1 | * | 11/2005 | Johnson et al. | 331/45 |
| 7,019,573 B2 | * | 3/2006 | Matsuno | 327/161 |
| 7,084,682 B2 | * | 8/2006 | Jeon et al. | 327/158 |
| 7,233,182 B1 | * | 6/2007 | Savoj | 327/141 |
| 2005/0189974 A1 | * | 9/2005 | Chao | 327/158 |
| 2006/0045222 A1 | * | 3/2006 | Kim et al. | 375/354 |

* cited by examiner

*Primary Examiner*—Cassandra Cox
(74) *Attorney, Agent, or Firm*—Bryan H. Wyman; Edward S. Mao; Silicon Valley Patent Group LLP

(57) ABSTRACT

A delay-locked loop (DLL) to produce a plurality of delayed clock signals comprising combinational logic for false lock detection is provided. The combinational logic uses only a subset of the plurality of delayed clock signals to provide a forward indicator indicating a delay period ($\Delta t$) is longer than a desired delay period. The combinational logic further provides a back indicator indicating the delay period ($\Delta t$) is shorter than a desired delay period.

33 Claims, 22 Drawing Sheets

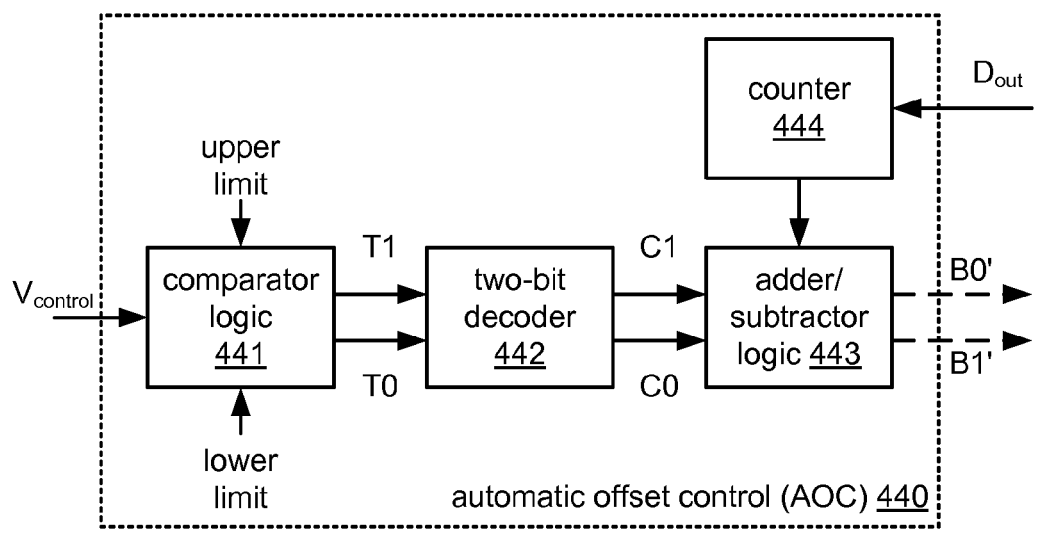
FIGURE 12A
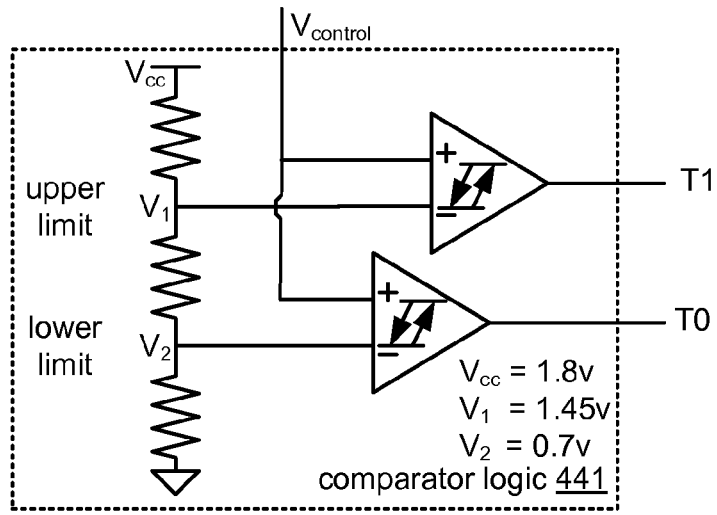
FIGURE 12B
| Input | | Output | | Description |
|---|---|---|---|---|
| T1 | T0 | C1 | C0 | |
| 0 | 0 | 0 | 1 | (−1) enable adder |
| 0 | 1 | 0 | 0 | (+0) no change |
| 1 | 0 | 1 | 0 | (+1) enable adder (i.c.) |
| 1 | 1 | 1 | 0 | (+1) enable subtractor |
2-bit decoder
FIGURE 12C

| Current | | Next | |
|---|---|---|---|
| B1 | B0 | B1' | B0' |
| 0 | 0 | 0 | 1 |
| 0 | 1 | 1 | 0 |
| 1 | 0 | 1 | 1 |
| 1 | 1 | 1 | 1 | adder

| Current | | Next | |
|---|---|---|---|
| B1 | B0 | B1' | B0' |
| 0 | 0 | 0 | 0 |
| 0 | 1 | 0 | 0 |
| 1 | 0 | 0 | 1 |
| 1 | 1 | 1 | 0 | subtractor

FALSE LOCK PROTECTION IN A DELAY-LOCKED LOOP (DLL)

CROSS-REFERENCE TO RELATED APPLICATIONS

Not applicable.

BACKGROUND OF THE INVENTION

1. Field of the Invention

The invention relates to delay-locked loops and clock generation, and in particular to false lock protection circuitry incorporated in delay-locked loops.

2. Background of the Invention

A delay-locked loop (DLL) processes a reference clock signal ($D_{ref}$) to generate a sequence of delayed clock signals. The frequency and period of the reference clock signal $D_{ref}$ are the same as those of each of the generated clock signals however each delayed clock signal is phase shifted by a common delay period ($\Delta t$) from the previous delayed clock signal. When operating properly, the DLL provides delayed clock signals with positive edge transitions that span a single period of the reference clock signal $D_{ref}$. Initially, the delay period $\Delta t$ might not be set to provide such properly spaced delayed clock signals spanning one and only one period of the reference clock signal $D_{ref}$. During initial acquisition, the DLL uses a feedback signal to adjust the delay period $\Delta t$ until the DLL converges and locks to an appropriate fixed delay period. Over time, the fixed delay period results in a sequence of delayed clock signals that may or may not span a single period of the reference clock signal.

When the DLL converges on an improper delay period, it is falsely locked. In this case, the delayed clock signals may span more than one period of the reference clock signal if the delay period $\Delta t$ is too long. Alternatively, the delayed clock signals may span a small fraction of one period of the reference clock signal if the delay period $\Delta t$ is too short.

One solution to determine if a DLL is falsely locked with an improper delay period is to apply all of the delayed clock signals to some combinational logic to determine if the delayed clock signals properly span one period of the reference clock signal $D_{ref}$. Combinational logic processing all of the delayed clock signals may allow a DLL to determine whether the DLL is falsely locked to a delay period that is either too long or too short.

Using all of the delayed clock signals, however, results in additional noise produced by the signals' combined high-low and low-high transitions. That is, noise may be an unwanted byproduct of a combinational logic processing a multitude of phases of the reference clock signal. This noise results from unintentional mixing of signals having a slightly different phase.

Thus, false lock protection circuitry may cause unwanted interfering noise at harmonics of the reference clock frequency. Therefore, a need exists to reduce noise generated by conventional false lock protection circuitry.

BRIEF SUMMARY OF THE INVENTION

Some embodiments of the present invention provide for a delay-locked loop (DLL) to produce a plurality of delayed clock signals wherein each pair of sequential clock signals forms a common delay period $\Delta t$, the DLL comprising: combinational logic comprising: an input port to accept a subset of the plurality of delayed clock signals wherein a total count of the plurality of delayed clock signals comprises a total value N and a total count of signals in the subset comprises a total subset value of N−2 or fewer signals; forward logic to provide a forward indicator, wherein the forward indicator indicates the delay period $\Delta t$ is longer than a desired delay period; back logic to provide a back indicator, wherein the back indicator indicates the delay period $\Delta t$ is shorter than a desired delay period; and an output port to provide the forward and back indicators.

Some embodiments of the present invention provide for a method in a delay-locked loop (DLL) to produce a plurality of delayed clock signals wherein each pair of sequential clock signals forms a common delay period $\Delta t$, the method comprising: generating the plurality of delayed clock signals having a delay period $\Delta t$, wherein a total count of the plurality of delayed clock signals comprises a total value N; generating forward and back indicators based on a subset of the plurality of delayed clock signals, wherein a total count of signals in the subset comprises a total subset value of N−2 or fewer signals; providing the forward and back indicators to charge pump logic.

These and other aspects, features and advantages of the invention will be apparent from reference to the embodiments described hereinafter.

BRIEF DESCRIPTION OF THE DRAWINGS

Embodiments of the invention will be described, by way of example only, with reference to the drawings.

FIGS. 11A, 11B and 12A through 12F show circuitry and tables associated with the DLL of FIG. 10 in accordance with the present invention.

DETAILED DESCRIPTION OF THE INVENTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense.

Furthermore, some portions of the detailed description which follows are presented in terms of procedures, steps, logic blocks, processing, and other symbolic representations of operations on data bits that can be performed in electronic circuitry or on computer memory. A procedure, computer executed step, logic block, process, etc., are here conceived to be a self-consistent sequence of steps or instructions leading to a desired result. The steps are those utilizing physical manipulations of physical quantities. These quantities can take the form of electrical, magnetic, or radio signals capable of being stored, transferred, combined, compared, and otherwise manipulated in electronic circuitry or in a computer system. These signals may be referred to at times as bits, values, elements, symbols, characters, terms, numbers, or the like. Each step may be performed by hardware, software, firmware, or combinations thereof.

Figure 1A:
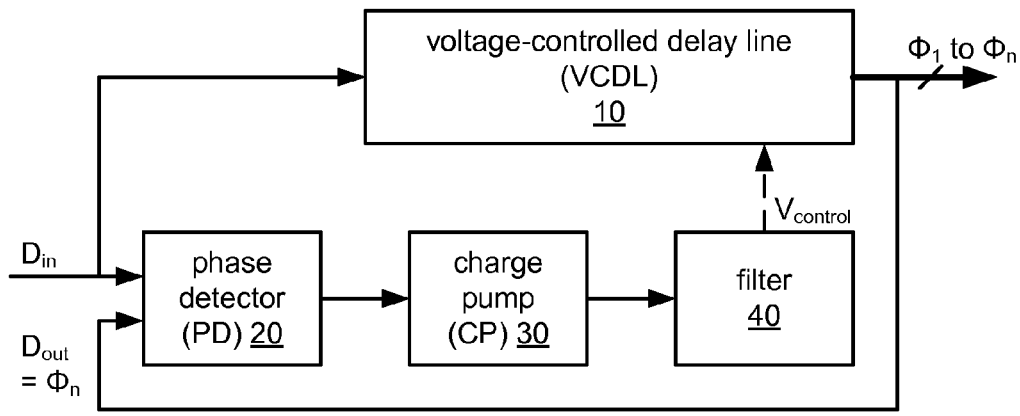
FIGS. 1A, 1B and 1C show a conventional DLL, a voltage controlled delay line (VCDL) and a filter, respectively.
Figure 1B:
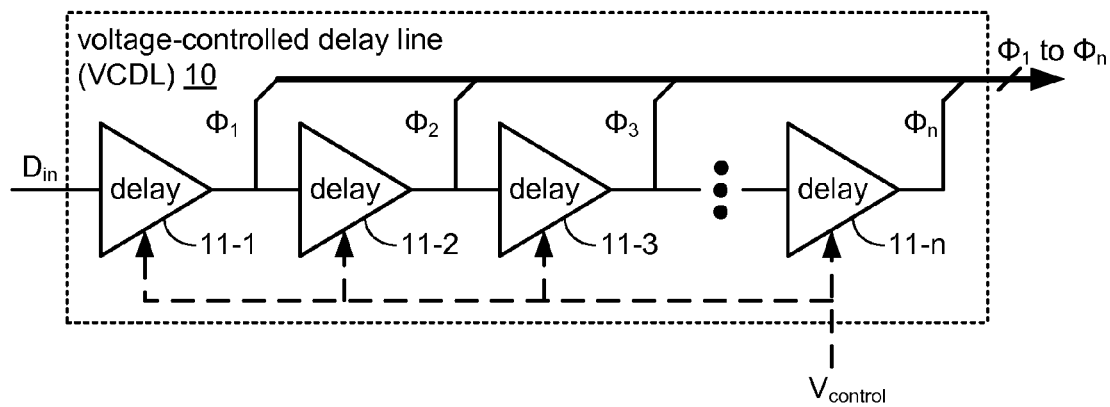
Figure 1C:
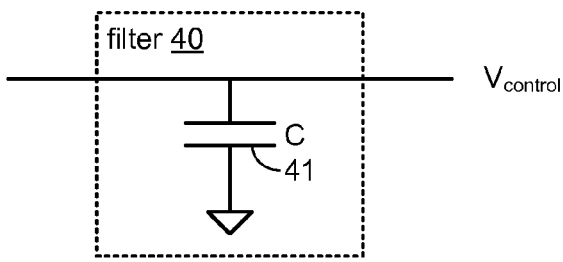

FIGS. 1A, 1B and 1C show a conventional delay-locked loop (DLL), a voltage controlled delay line (VCDL) and a filter, respectively. The conventional DLL of FIG. 1A includes a voltage controlled delay line (VCDL) 10, a phase detector (PD) 20, a charge pump (CP) 30 and a capacitive filter 40. VCDL 10 accepts a source signal ($D_{in}$) from which it produces N delayed output signals $\{\Phi_1, \Phi_2, \Phi_3, \ldots, \Phi_{n-1}, \Phi_n\}$. For example, if the source signal $D_{in}$ is a clock signal, the N output signals $\{\Phi_1, \Phi_2, \Phi_3, \ldots, \Phi_{n-1}, \Phi_n\}$ are delayed clock signals each identical to the input source signal $D_{in}$ except for a phase delay. A difference between the source signal $D_{in}$ and feedback signal $D_{out}$ (where $D_{out}=\Phi_n$) in PD 20 drives CP 30, which feeds filter 40 to create a control signal $V_{control}$. The control signal $V_{control}$ sets the delay in VCDL 10, which in turn is used to set the phase delay and to create the N output signals $\{\Phi_1, \Phi_2, \Phi_3, \ldots, \Phi_{n-1}, \Phi_n\}$.

FIG. 1B shows VCDL 10 having N delay elements 11-1, 11-2, ..., 11-n configured to produce N delayed clock signals $\{\Phi_1, \Phi_2, \Phi_3, \ldots, \Phi_{n-1}, \Phi_n\}$. Each delay element 11-1, 11-2, ..., 11-n introduce an additional delay period $\Delta t$ on the input signal $D_{in}$. A common control signal ($V_{control}$) shared by each delay element sets this common incremental delay period $\Delta t$. As a result, each pair of sequential clock signals (i.e., $\Phi_j$ & $\Phi_{j+1}$ for j=1 to n−1), from the plurality of delayed clock signals $\{\Phi_1, \Phi_2, \Phi_3, \ldots, \Phi_{n-1}, \Phi_n\}$, is temporally separated by the common delay period $\Delta t$.

FIG. 1C shows a filter 40 including a capacitive element (C) 41 for holding a charge to represent the voltage based control signal $V_{control}$ from the charge pump logic of FIG. 1A. In accordance with the present invention, a delay line 10 may be controlled by a voltage signal, as shown in FIGS. 1A and 1B. Similarly, a delay line may be controlled by a current signal $I_{control}$ as described below with reference to FIG. 4.

FIGS. 2A through 2E show properly locked, unlocked and falsely locked DDLs each generating eight delayed clock signals $\{\Phi_1, \Phi_2, \Phi_3, \Phi_4, \Phi_5, \Phi_6, \Phi_7, \Phi_8\}$ with respect to a reference clock $D_{ref}$ and a desired output clock signal (desired $D_{out}$) of an exemplary system.

Figure 2A:
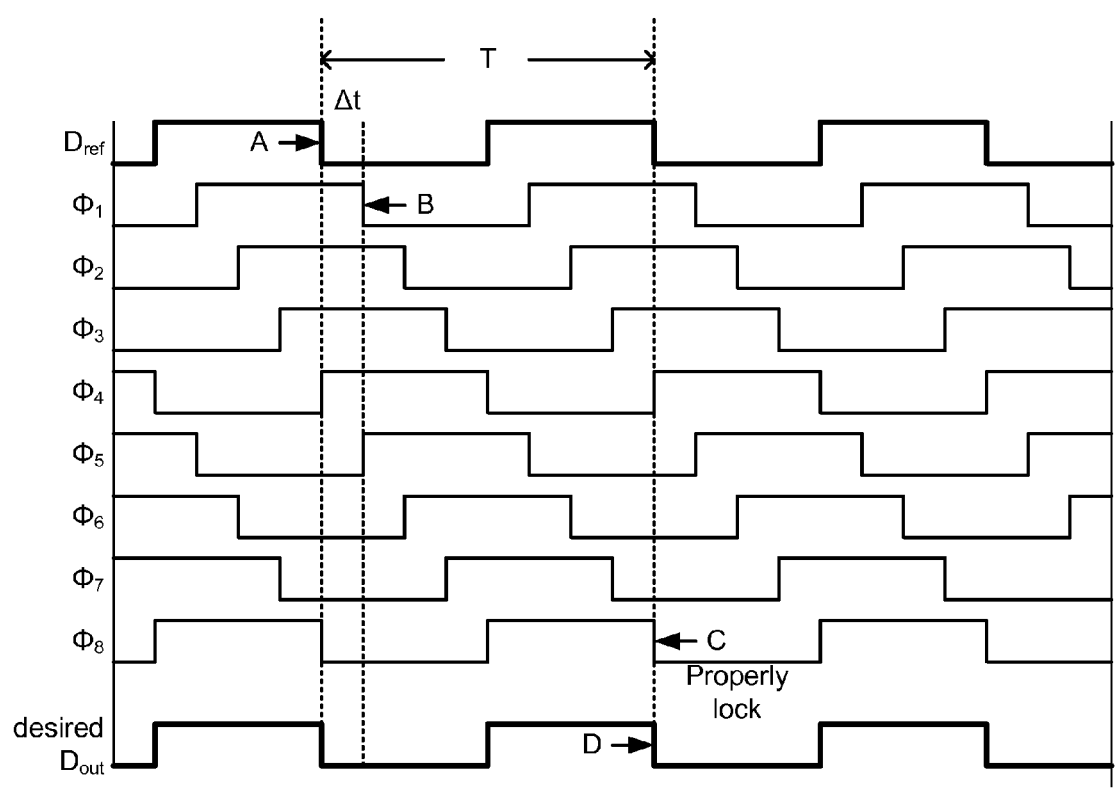
FIGS. 2A through 2E show a plurality of delayed clock signals with respect to a reference clock $D_{ref}$ and a desired output clock signal (desired $D_{out}$).

In FIG. 2A, a properly locked system produces eight delayed clock signals $\{\Phi_1, \Phi_2, \Phi_3, \Phi_4, \Phi_5, \Phi_6, \Phi_7, \Phi_8\}$ each having a common delay period $\Delta t$ between each pair of sequential clock signals. When locked, the input signal $D_{ref}$ and the desired output signal (desired $D_{out}$) ideally have no phase difference, thus $D_{out}$ has converged to $D_{ref}$ (where $D_{out}=\Phi_n$). Additionally, when properly locked, $D_{out}$ is delayed by a single period T, thus the cumulative delay (N*$\Delta t$) between the sequential clock signals is also a single period T. A DLL in this state does not need to adjust the common delay period $\Delta t$.

The illustration shows the input reference signal $D_{ref}$ having a period of T (duration between points 'A' and 'C'). This input reference signal $D_{ref}$ is delayed by $\Delta t$ (duration between points 'A' and 'B') to produce $\Phi_1$. Signal $\Phi_2$ is delayed by an additional time $\Delta t$ and each subsequent signal is similarly delay by an additional incremental time $\Delta t$. Coinciding temporal points 'C' and 'D' illustrate that the last delayed signal $\Phi_8$ represents the input reference signal $D_{ref}$ delayed by a full delay period T, thus proper delaying of each of the 8 delayed clock signals $\{\Phi_1, \Phi_2, \Phi_3, \Phi_4, \Phi_5, \Phi_6, \Phi_7, \Phi_8\}$ is achieved. Formulaically, N*$\Delta t$=T, where N is total numbers of delays, $\Delta t$ is the common delay period and T is the period of the input reference signal $D_{ref}$.

Figure 2B:
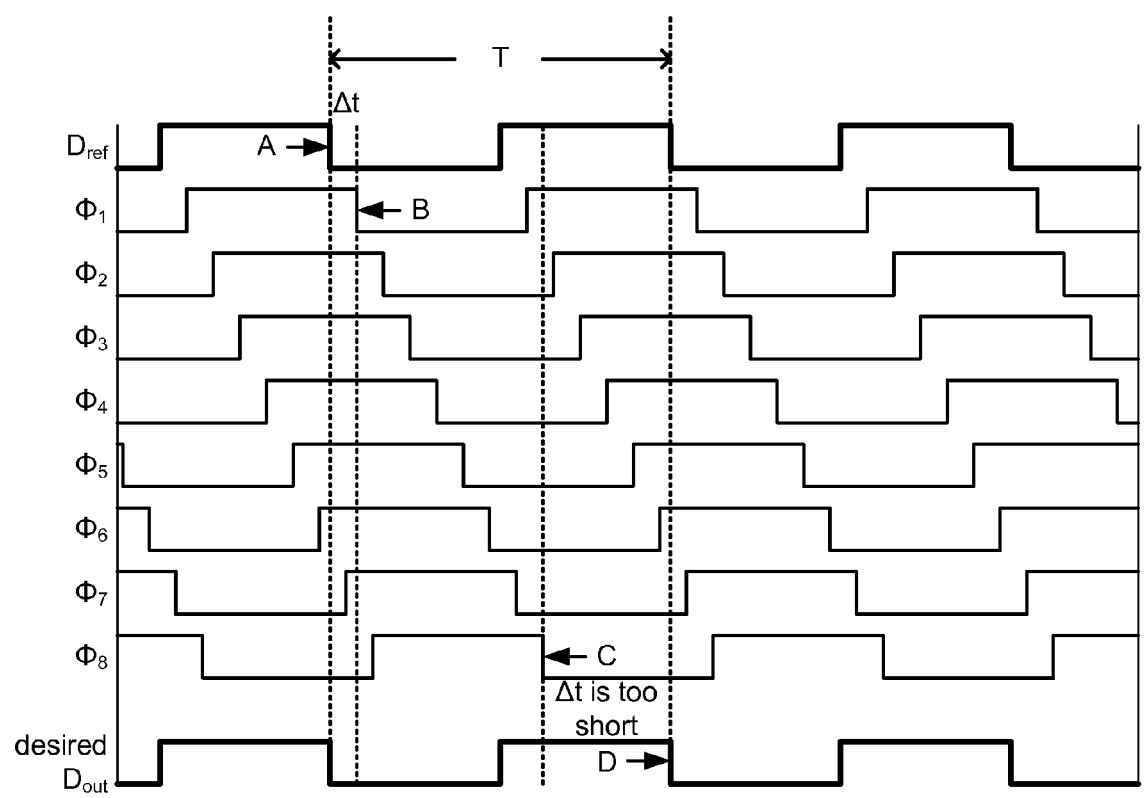

FIG. 2B shows a DLL that has not yet locked. Because the duration of $\Delta t$ (between points 'A' and 'B') is too short, the accumulated delay does not approach the input signal's period T and the resulting last delayed signal $\Phi_8$ is delayed by less than a single delay period T. As shown, a substantial duration exists between points 'C' of $\Phi_8$ and 'D' of the desired output signal, therefore the DLL has not properly locked. With time, the DLL feedback mechanism may attempt to incorrectly drive $\Delta t$ to an even shorter duration $\Delta t$, however, once a minimum value is reached $\Delta t$ can be driven no lower. Thus, the DLL remains in the unlocked state. In such an unlocked state, a DLL may use false lock protection circuitry to increase the common delay period $\Delta t$.

Figure 2C:
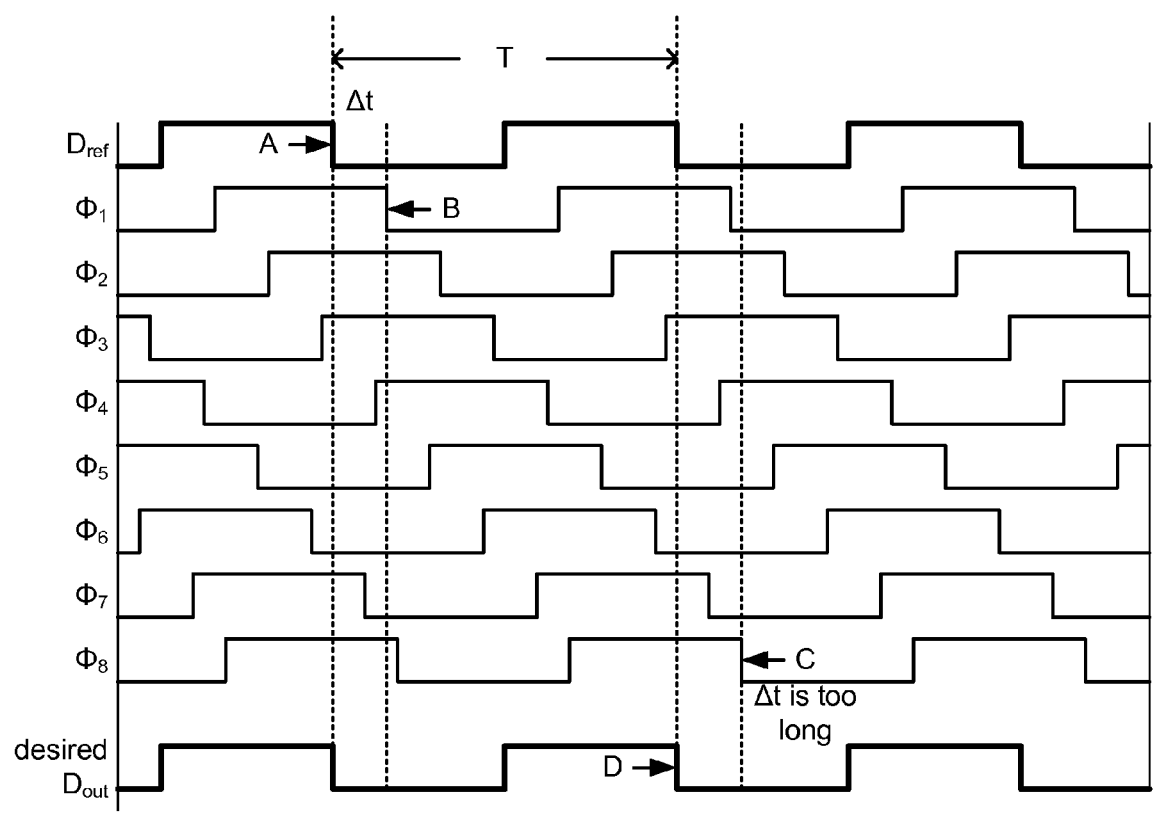

FIG. 2C shows another DLL that has failed to properly locked. Because $\Delta t$ (duration between points 'A' and 'B') is too long, the accumulated delay of $\Phi_8$ exceeds the period T of the input reference signal $D_{ref}$ and the resulting last delayed signal $\Phi_8$ has a cumulative delay of more than one delay period T. A substantially non-zero duration exists between points 'C' of $\Phi_8$ and 'D' of the desired output signal (desired $D_{out}$), therefore the DLL has not yet locked or is improperly locked. With time, the DLL feedback mechanism may drive $\Delta t$ of an unlocked system to a properly locked state. If falsely locked, false lock protection circuitry in a DLL may decrease the common delay period $\Delta t$.

Figure 2D:
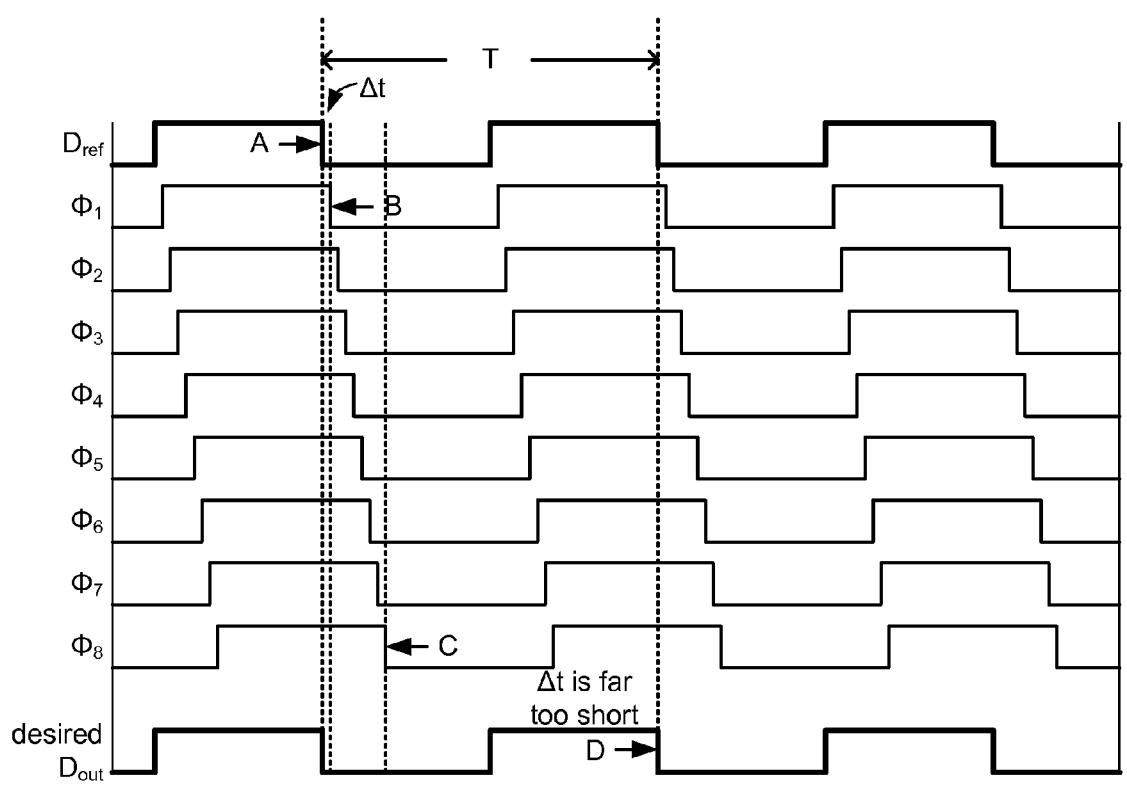

In FIG. 2D, as with FIG. 2B, $\Delta t$ (duration between points 'A' and 'B') is too short. In this case, $\Delta t$ may be so short as to cause a DLL without false lock protection circuitry to drive $\Delta t$ to a small minimum value. Again, the accumulated delay does not approach the input signal's period T and the resulting last delayed signal $\Phi_8$ has an accumulated delayed that is far less than a single delay period T. False lock protection circuitry in a DLL may increase the common delay period $\Delta t$.

Figure 2E:
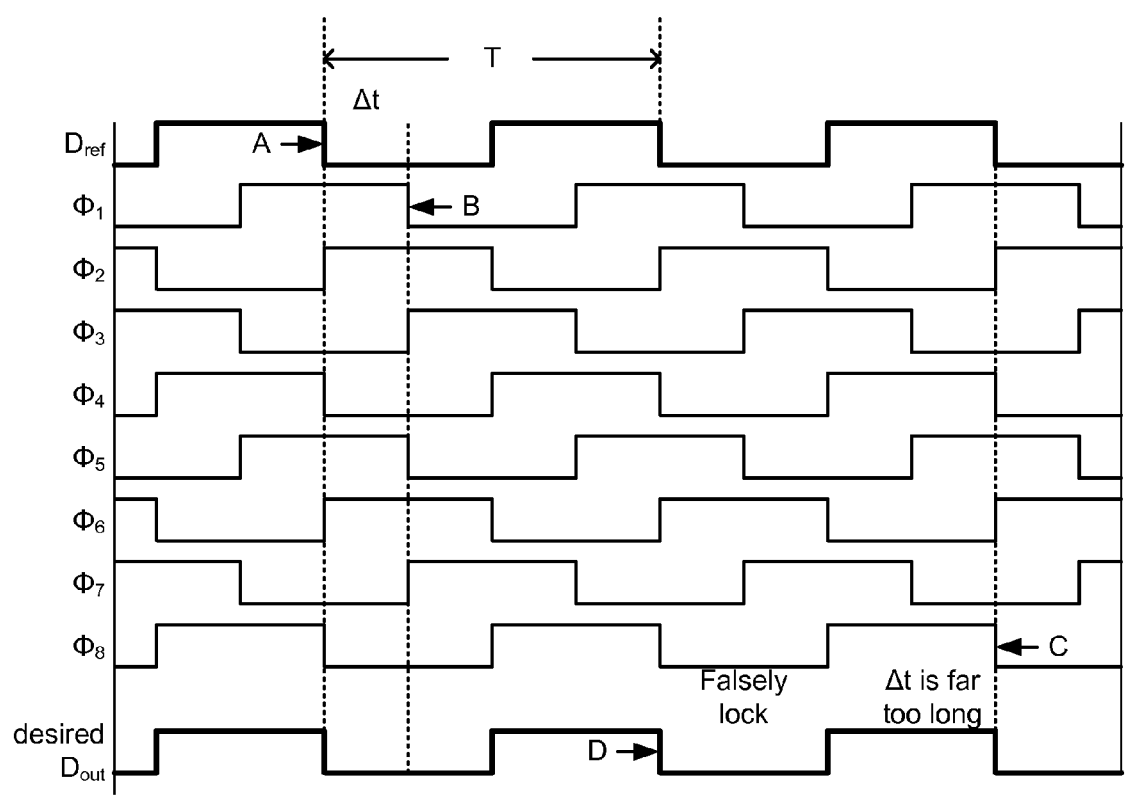

In FIG. 2E, as with FIG. 2C, $\Delta t$ (duration between points 'A' and 'B') is too long. In this case, $\Delta t$ may be so long as to cause a DLL without false lock protection circuitry to drive $\Delta t$ to an integer multiple of period T that would result in a proper lock. That is, the accumulated delay (N*$\Delta t$) may approach a positive integer multiple of the input signal's period T. In this case, the resulting last delayed signal $\Phi_8$ may be driven such that its accumulated delay is a multiple of period T. Again, false lock protection circuitry in a DLL may be used to decrease the common delay period $\Delta t$.

Figure 3A:
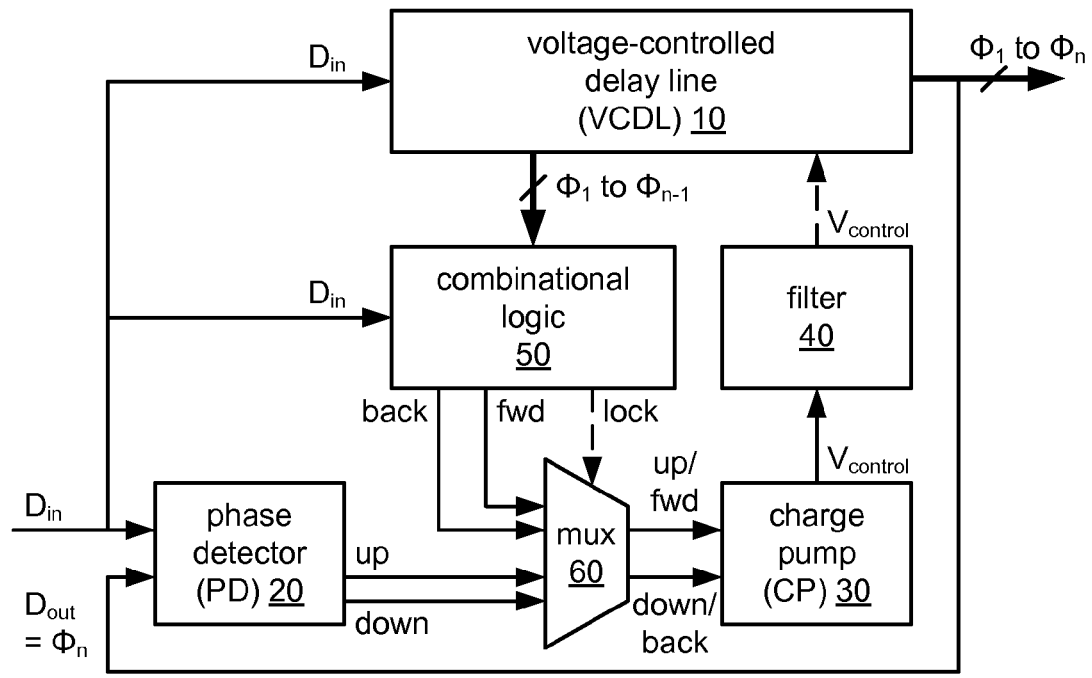
FIGS. 3A and 3B show a conventional DLL and associated combinational logic for providing false lock protection.
Figure 3B:
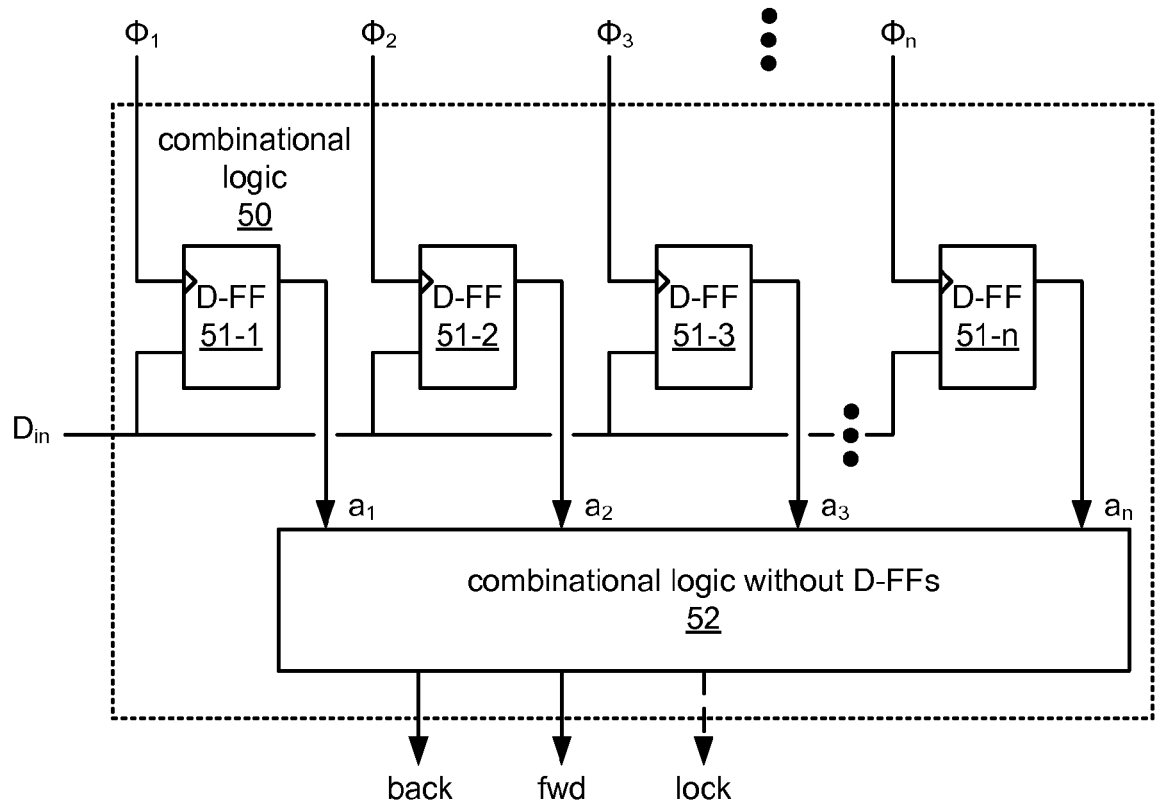

FIGS. 3A and 3B show a conventional DLL and associated combinational logic 50 for providing false lock protection. Combinational logic 50 provides false lock protection in a DLL. For further examples, see U.S. Pat. No. 6,844,761 issued on Jan. 18, 2005, by named inventor Byun and titled "DLL with false lock protector", the contents of which are incorporated by reference herein and referred to as Byun below.

In FIG. 3A, a full sequence of N delayed signals $\{\Phi_1, \Phi_2, \Phi_3, \ldots, \Phi_{n-1}, \Phi_n\}$ are fed back to ultimately effect the common delay period $\Delta t$. Delayed signals $\{\Phi_1, \Phi_2, \Phi_3, \ldots, \Phi_{n-2}, \Phi_{n-1}\}$ are used by combinational logic 50 to produces back, forward and lock indicators and the last delayed signal $\Phi_n$ is used by PD 20 to produce a down or up indicator.

When properly functioning, delay line 10 delays last signal $\Phi_n$ by a full and single period (T) of the input source signal $D_{in}$. When falsely locked, the delay line 10 either delays the last delay signal $\Phi_n$ by an amount approximately equal to multiple periods (nT) or by an amount substantially less than a single period T. By performing logical operations on the delayed signals $\{\Phi_1, \Phi_2, \Phi_3, \ldots, \Phi_{n-2}, \Phi_{n-1}\}$, combinational logic 50 indicates whether the signal $\Phi_n$ is properly delayed by an amount within an allowable tolerance around a single period T.

When combinational logic 50 determines the last delay signal $\Phi_n$ is delayed by approximately a single period T, combinational logic 50 generates a lock indicator to control routing though a multiplexer (mux) 60. That is, when $\Phi_n$ is sufficiently close to a one-T delay, combinational logic 50 provides a lock indicator to mux 60. Based on a lock indicator produced, either the down/up indicator pair or the back/forward indicator pair is routed through mux 60 to CP 30. Therefore when locked, mux 60 passes the down/up indicator pair from PD 20 to CP 30. On the other hand, when $\Phi_n$ is not sufficiently close to a one-T delay, combinational logic 50 sends a not-lock indication to mux 60, which therefore routes the back/forward indicator pair from combinational logic 50 to CP 30.

An up indicator from PD 20 or a forward indicator from combinational logic 50 instructs CP 30 to send a control signal to decrease the common delay period $\Delta t$. For example, a control voltage $V_{control}$ may be increased, which may speed up the operation in each delay unit 11-i (FIG. 1B), which will shorted the common delay period $\Delta t$ imposed on the input signals.

Similarly, a down indicator from PD 20 or a back indicator from combinational logic 50 instructs CP 30 to send a control signal increase the common delay period $\Delta t$. For example, a control voltage $V_{control}$ may be decreased, which may slowdown the operation in each delay unit 11-i (FIG. 1B), which will length the common delay period $\Delta t$ imposed on the input signals.

Therefore, through the feedback of the N delayed clock signals $\{\Phi_1, \Phi_2, \Phi_3, \ldots, \Phi_{n-1}, \Phi_n\}$, the circuitry of FIG. 3A used feedback signals and control signals to drive the common delay period $\Delta t$ such that delay line 10 delays the last signal $\Phi_n$ by a single period T. Unfortunately, combinational logic 50 operating on a large number of skewed clock signals may produce unwanted noise as described above.

FIG. 3B shows combinational logic 50 having N D-type delay flip flops (D-FFs) 51-1, 51-2, 51-3, . . . , 51-n each latching a respective one of the N delayed clock signals $\{\Phi_1, \Phi_2, \Phi_3, \ldots, \Phi_{n-1}, \Phi_n\}$. The resulting N latched signals $a_1, a_2, a_3, \ldots, a_n$ are provided to combinational logic 52 to produce back, forward and lock indicators.

A delay line with N=8 delays: the back indicator may be computed logically as ($(a_1$ AND $a_2$ AND NOT $a_3)$ OR $(a_1$ AND NOT $a_2)$); the forward indicator may be computed logically as ($a_1$ AND $a_2$ AND $a_3$ AND $a_4$ AND $a_5$ AND $a_6$ AND $a_7$); and the lock indicator may be computed logically as (NOT forward AND NOT back) as described in Byun. As used in Byun, a down (or back) indicator of '0' may mean inaction (take no action to increase delay time) whereas a down indicator of '1' may mean action (take action to increase the delay time). Alternatively, a down indicator of '0' may mean inaction and a down indicator of '1' may mean action as used herein below.

Figure 4:
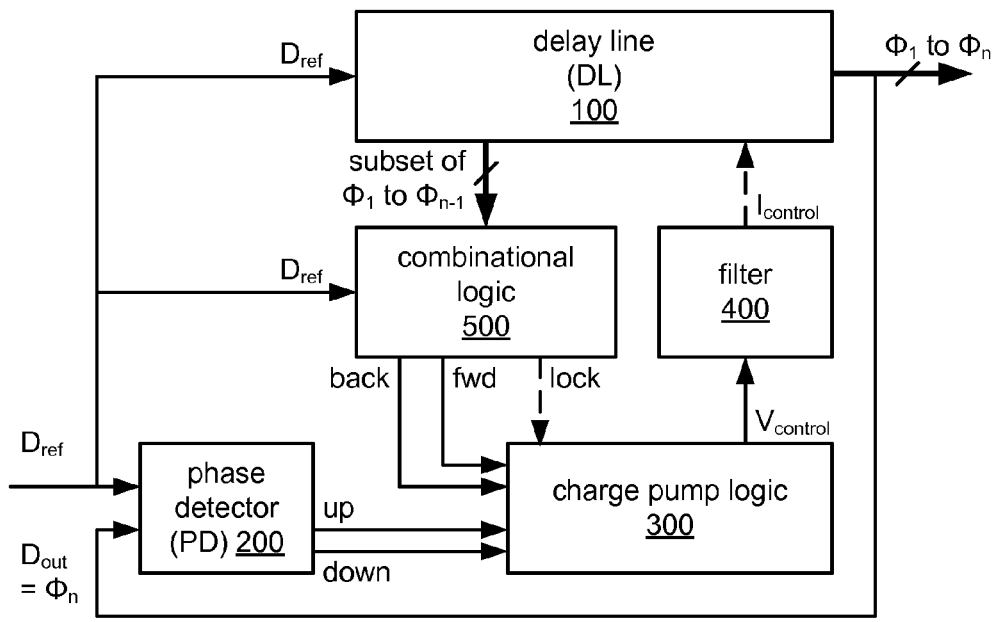
FIG. 4 shows a DLL in accordance with the present invention.

FIG. 4 shows a DLL in accordance with the present invention. The DLL includes a delay line (DL) 100, a phase detector 200, charge pump logic 300, a filter 400 and combinational logic 500 providing false lock protection circuitry. DL 100 accepts an input reference signal $D_{ref}$ from which it produces N delayed output signals $\{\Phi_1, \Phi_2, \Phi_3, \ldots, \Phi_{n-1}, \Phi_n\}$. For example, if the reference signal $D_{ref}$ is a clock signal, the N delayed clock output signals $\{\Phi_1, \Phi_2, \Phi_3, \ldots, \Phi_{n-1}, \Phi_n\}$ are delayed clock signals each identical to the input source signal $D_{ref}$ except for its phase delay. A difference between the reference signal $D_{ref}$ and feedback signal $D_{out}$ (where $D_{out} = \Phi_n$) in PD 200 is used to generate down and up indicators that drive charge pump logic 300, which feeds to filter 400 a control signal $V_{control}$ to filter 400. Filter 400 in turn creates a current control signal $I_{control}$ from the voltage control signal $V_{control}$. The current control signal $I_{control}$ is used to set the common delay period $\Delta t$ in delay line 100 as described above with reference to delay line 10.

Unlike combinational logic 50 of FIG. 3A, combinational logic 500 of FIG. 4 accepts a subset of the produced N−1 delayed clock signals $\{\Phi_1, \Phi_2, \Phi_3, \ldots, \Phi_{n-1}\}$ rather than all of the N−1 delayed clock signals. The reduced subset of delayed clock signals, which are used to generate back, forward and lock indicators advantageously aids in reducing noise otherwise generated in combinational logic 50. Each delayed signal not process in combinational logic 500 reduces noise that may be otherwise generated from unwanted cross products of the phase delayed signals.

Figure 5A:
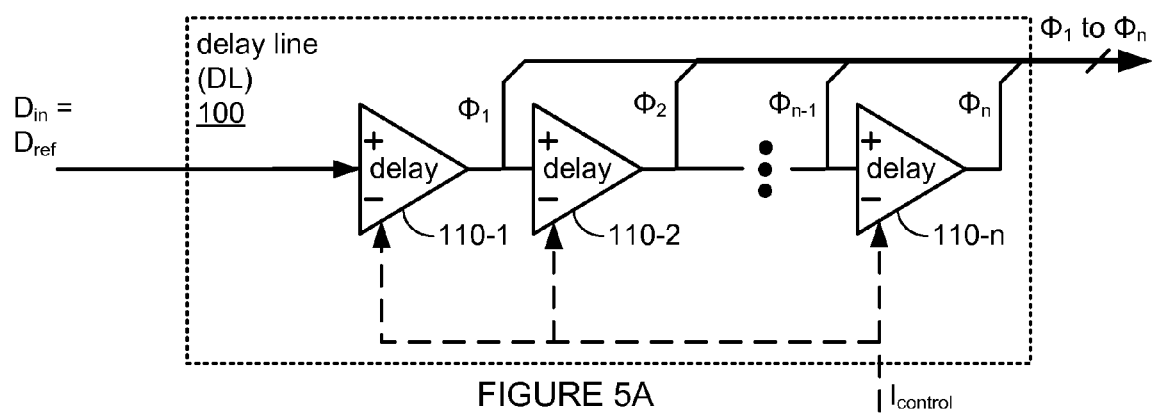
FIGS. 5A through 5F show embodiments of a delay line (DL) 100 and supporting circuitry for the DLL of FIG. 4 in accordance with the present invention.
Figure 5B:
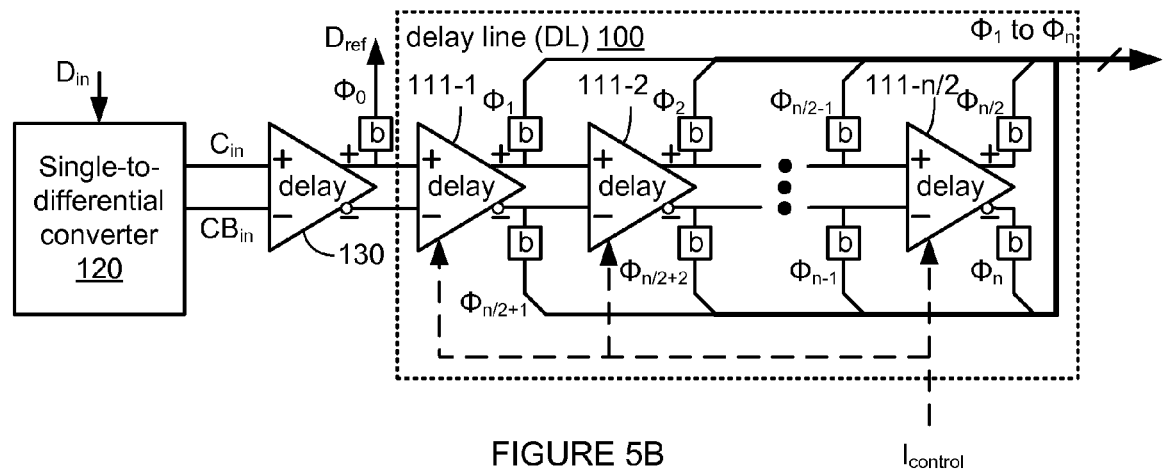

FIGS. 5A through 5F show embodiments of a delay line (DL) 100 and supporting circuitry for the DLL of FIG. 4 in accordance with the present invention. DL 100 may be controlled by various means. For example, DL 100 may be controlled by a voltage level as shown in FIGS. 1A and 3A. Alternatively, DL 100 may be controlled by a current level as shown in FIG. 4. Additionally, DL 100 may include non-differential delay elements as shown in FIG. 5A or may include differential delay elements as shown in FIG. 5B, both described below.

FIG. 5A shows a current controlled non-differential delay line 100 having N delay elements 110-1, 110-2, . . . , 110-n configured to produce N delayed clock signals $\{\Phi_1, \Phi_2, \Phi_3, \ldots, \Phi_{n-1}, \Phi_n\}$. Each delay element 110-1, 110-2, . . . , 110-n introduces a delay period $\Delta t$ to its input signal. A common control signal ($I_{control}$) shared by each delay element coordinates this common delay period $\Delta t$. As a result, each pair of sequential clock signals (i.e., $\Phi_j$ & $\Phi_{j+1}$ for j=1 to n−1), from the plurality of delayed clock signals $\{\Phi_1, \Phi_2, \Phi_3, \ldots, \Phi_{n-1}, \Phi_n\}$, forms the common delay period $\Delta t$.

FIG. 5B shows current controlled differential delay line 100 having N/2 delay elements 111-1, 111-2, . . . , 111-n/2 configured to produce N delayed clock signals $\{\Phi_1, \Phi_2, \Phi_3, \ldots, \Phi_{n-1}, \Phi_n\}$. A complement of the first N/2 delayed clock signals $\{\Phi_1, \Phi_2, \Phi_3, \ldots, \Phi_{n/2}\}$ may be used to produce the second N/2 delayed clock signals $\{\Phi_{n/2+1}, \Phi_{n/2+2}, \ldots, \Phi_n\}$. For example, the complement of $\Phi_1$ may be used to represent $\Phi_{n/2+1}$ and the complement of $\Phi_2$ may be used to represent $\Phi_{n/2+2}$.

To condition the delayed clock signals $\{\Phi_1, \Phi_2, \Phi_3, \ldots, \Phi_n\}$ buffers 'b' may be added to between a differential output port of the delay unit 111-i and the supplied delayed clock signal as shown. Furthermore, a delay unit 130 may be added to generate and provide proper timing and signal levels of the reference signal ($D_{ref}=\Phi_0$). Additionally, a non-differential input signal $D_{in}$ may be converted to differential input signals ($C_{in}$ and $CB_{in}$) using a single-to-differential converter 120. In this case, the generated reference signal $D_{ref}$ rather than the original input $D_{in}$ may be used as an input to phase detector 200.

Figure 5C:
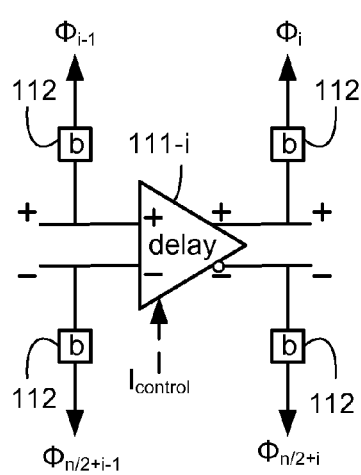

FIG. 5C shows a representative delay element 111-i having differential input ports and differential output ports. A positive differential input port accepts a first delayed signal ($\Phi_{i-1}$) and a negative differential input port accepts a second delayed signal ($\Phi_{n/2+i-1}$). A current control signal $I_{control}$ is used to set the currently-used common delay period $\Delta t$. After imposing such a delay, the delay element 111-i provides a first delayed signal (namely, $\Phi_i$) at a positive differential output port and a second delayed signal (namely, $\Phi_{n/2+i}$) at a negative differential output port. To condition the delayed clock signals, buffers 112 may be added to between each differential output port of the delay unit 111-i and the respective delayed clock signal.

Figure 5D:
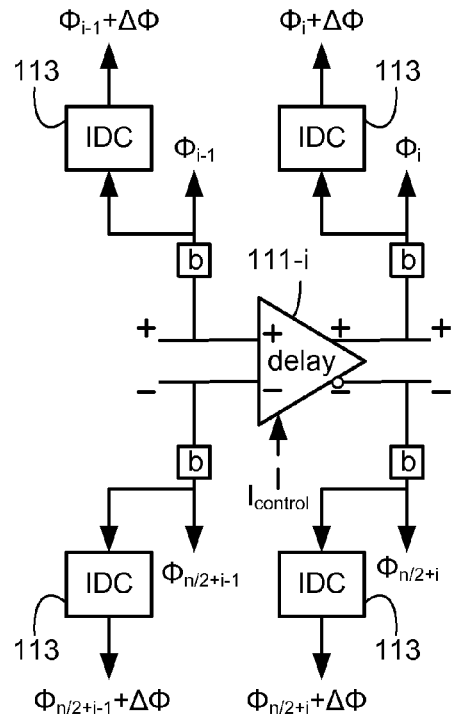

FIG. 5D shows an alternate representative delay element 111-i that provides twice as many output signals. For example, a DLL system designed to generate 32 delayed clock signals may be redesigned to produce 64 delayed clock signals without adding additional delay elements 111-i. In some embodiments each delayed output signal $\Phi_i$ is also fed to an interpolation delay cell (IDC) 113. In effect, IDC 113 generates a signal $\Phi_i+\Delta\Phi$ that represents a delayed signal approximately halfway between $\Phi_i$ and $\Phi_{i-1}$. The sequence of delayed clock signals $\{\Phi_1, \Phi_1+\Delta\Phi, \Phi_2, \Phi_2+\Delta\Phi, \Phi_3, \Phi_3+\Delta\Phi, \ldots, \Phi_n, \Phi_n+\Delta\Phi\}$ may be renumbered as $\{\Phi_1, \Phi_2, \Phi_3, \ldots, \Phi_{2n}\}$. For example, $\{\Phi_1, \Phi_1+\Delta\Phi, \Phi_2, \Phi_2+\Delta\Phi, \Phi_3, \Phi_3+\Delta\Phi, \ldots, \Phi_{32}, \Phi_{32}+\Delta\Phi\}$ may be renumbered as $\{\Phi_1, \Phi_2, \Phi_3, \ldots, \Phi_{64}\}$.

Figure 5E:
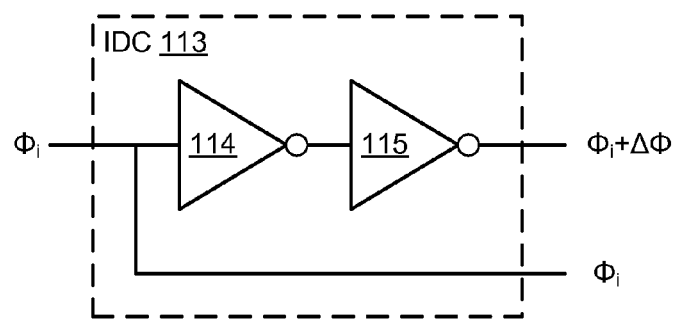

FIG. 5E shows an example embodiment of IDC 113. One or more delay devices may be selected, such as a pair of inverters (114 and 115), to introduce an extra propagation time $\Delta\Phi$, where $\Delta\Phi$ equals approximately $\Delta t/2$.

Figure 5F:
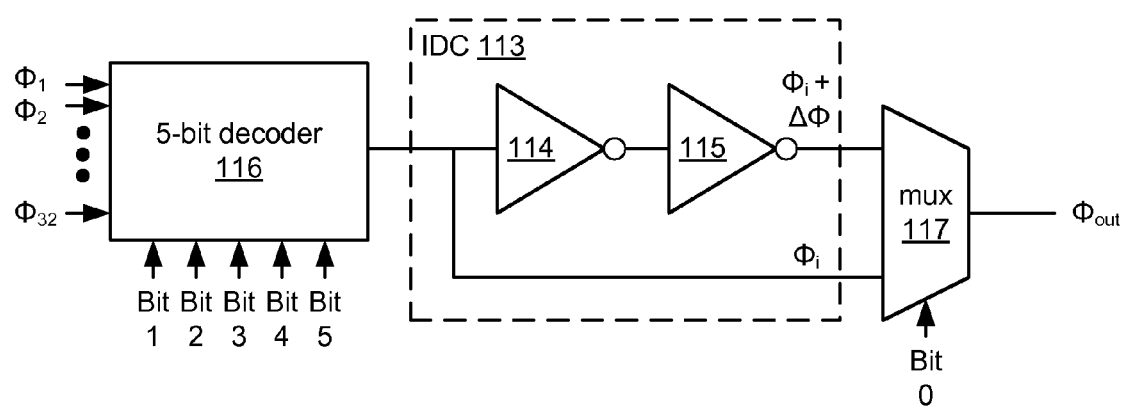

FIG. 5F shows an alternate embodiment wherein one IDC 113 may be used to delay a selected delayed clock signal. For example, five bits (Bit 1 to Bit 5) may be used by a 5-bit decoder 116 to select one of 32 input signals $\{\Phi_1, \ldots, \Phi_{32}\}$. The selected signal $\Phi_i$ may then be passed through inverters 114 and 115 to provide a representative interpolated signal $\Phi_i+\Delta\Phi$. Another bit (Bit 0) may be used as a selection bit to a multiplexer (mux) 117 to selects either the signal $\Phi_i$ from decoder 116 or the representative interpolated signal $\Phi_i+\Delta\Phi$ from IDC 113. Mux 117 may provide an output signal $\Phi_{out}$ for use in combinational logic 500.

FIGS. 6A through 6E show embodiments of combinational logic 500 for the DLL of FIG. 4 for various values of N. Combinational logic 500 may be comprised of forward logic 510, back logic 520 and lock logic 530. This logic may be comprised of registers, such as D-FFs, and logic gates, such as NOR and AND gates. Applied as input signals to combinational logic 500 is a subset $\{\Phi_{x1}, \Phi_{x2}, \Phi_{x3}, \ldots, \Phi_{xm}, \Phi_{y1}, \ldots, \Phi_{yp}\}$ selected from the set of delayed clock signals $\{\Phi_1, \Phi_2, \Phi_3, \ldots, \Phi_{n-1}\}$, where a subset has fewer elements than the set. That is, the forward, back and lock indicators may be generated with a logical combination of this subset of signals without reference to other delayed clock signals not in the subset. Additionally, a subset that excludes terms near the end of the delay chain can more quickly determine whether or not a DLL is locked. For example, excluding $\Phi_{n-1}$ and/or $\Phi_n$ from the subset means that the DLL may more quickly have valid parameters to compute forward, back and lock indicators.

With respect to FIGS. 6A through 6E, combinational logic 500 uses the subset of signals to generate forward, back and lock indicators. A resulting forward indicator having a value of logical '0' means action (the forward logic 510 has determined an adjustment to shorten the common delay period $\Delta t$ through the control signal is necessary). On the other hand, a resulting forward indicator having a value of logical '1' means inaction (the forward logic 510 has determined that no shortening adjustment is necessary).

A resulting back indicator having a value of logical '0' means that the back logic 520 has determined an adjustment to lengthen the common delay period $\Delta t$ through the control signal is necessary. On the other hand, a resulting back indicator having a value of logical '1' means that the back logic 520 has determined that no lengthening adjustment is necessary.

A resulting lock indicator having a value of logical '1' means that the lock logic has determined neither the forward nor back indicators from combinational logic 500 are relevant to charge pump logic 300. On the other hand, a resulting lock indicator having a value of logical '0' means that charge pump logic 300 should apply either the forward or back indicator from combinational logic 500 thereby aiding to prevent a false lock situation and/or aiding to converge to a proper common delay period $\Delta t$.

Once a designer selects a total number of delayed clock signals that the DLL will generate (e.g., N=32 signals), the subset may be determined by observation. To determine a subset by observation, the designer may plot a sequence of charts wherein each chart represents a different delay period $\Delta t$ and shows multiple periods of the resulting delayed clock signals. The designer may visually determine which subset of delayed clock signals identifies when a false lock situation may occur. Alternatively, it may be possible to determine the subset numerically. For example, the designer might be able to use a simulation tool or numerical analysis software to determine which subset of clock signals produce a linearly independent set of signals over a duration of time spanning several periods (e.g., 10 to 30 periods).

Figure 6A:
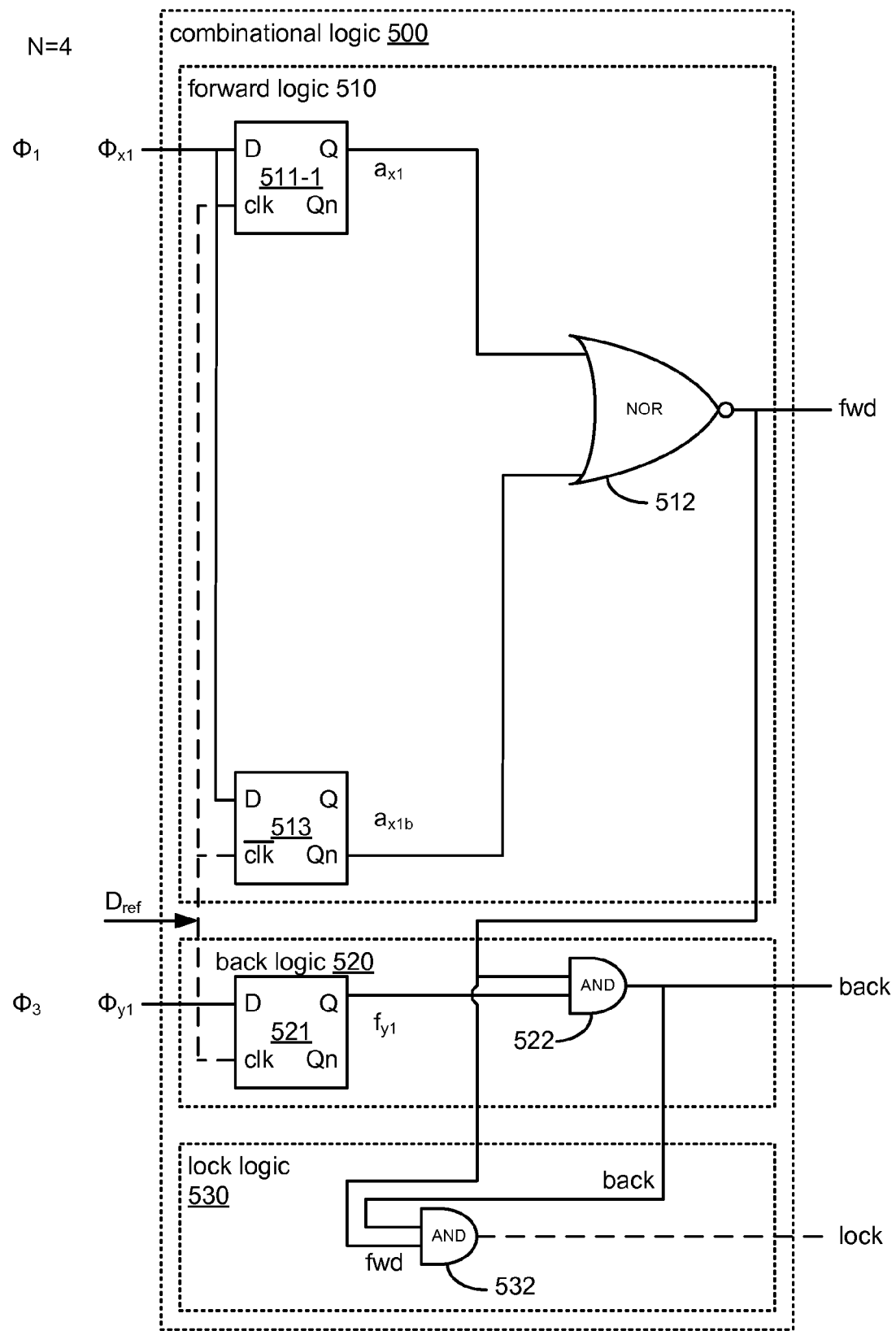
FIGS. 6A through 6E show embodiments of combinational logic for the DLL of FIG. 4 in accordance with the present invention.

FIG. 6A shows combinational logic 500 for N=4. An N=4 DLL produces four output signals $\{\Phi_1, \ldots, \Phi_4\}$, of which N−2 or fewer signals are provided to combinational logic 500. In the example shown, combinational logic 500 accepts two input signals (namely, $\Phi_1$ and $\Phi_3$) to generate forward, back and lock indicators. A forward indicator may be generated with a single input signal (e.g., forward=$\Phi_{x1}$ wherein $\Phi_{x1}=\Phi_1$); a back indicator may be set using two input signals (back=(forward AND $\Phi_{y1}$) wherein $\Phi_{y1}=\Phi_3$); and a lock indicator may be comprised of an AND operation between the forward and back indicators.

In the example shown, forward logic 510 includes a D-FF 511-1 accepting a single input signal $\Phi_{x1}$ and providing an output signal $a_{x1}$ used to define the forward indicator. Also include is a second D-FF 513 accepting the same input signal $\Phi_{x1}$ and providing an output signal $a_{y1b}$ that may also be used to define the forward indicator. The two flip flops, however, are clocked by opposite edges of the reference input signal $D_{ref}$ as shown. The second D-FF 513 is optional and may be used as protection against an initial condition that might otherwise introduce a false signal onto the forward indicator. A NOR gate 512 is shown to combine $a_{x1}$ and $a_{y1b}$ to generator the forward indicator. Back logic 520 includes a D-FF 521 to accept $\Phi_{y1}$ and produce $f_{y1}$, which is fed to an AND gate 522 along with the forward indicator to define the back indicator. Lock logic 530 includes an AND gate 532 that accepts both the forward and back indicators and provides the lock indicator as an output signal.

Figure 6B:
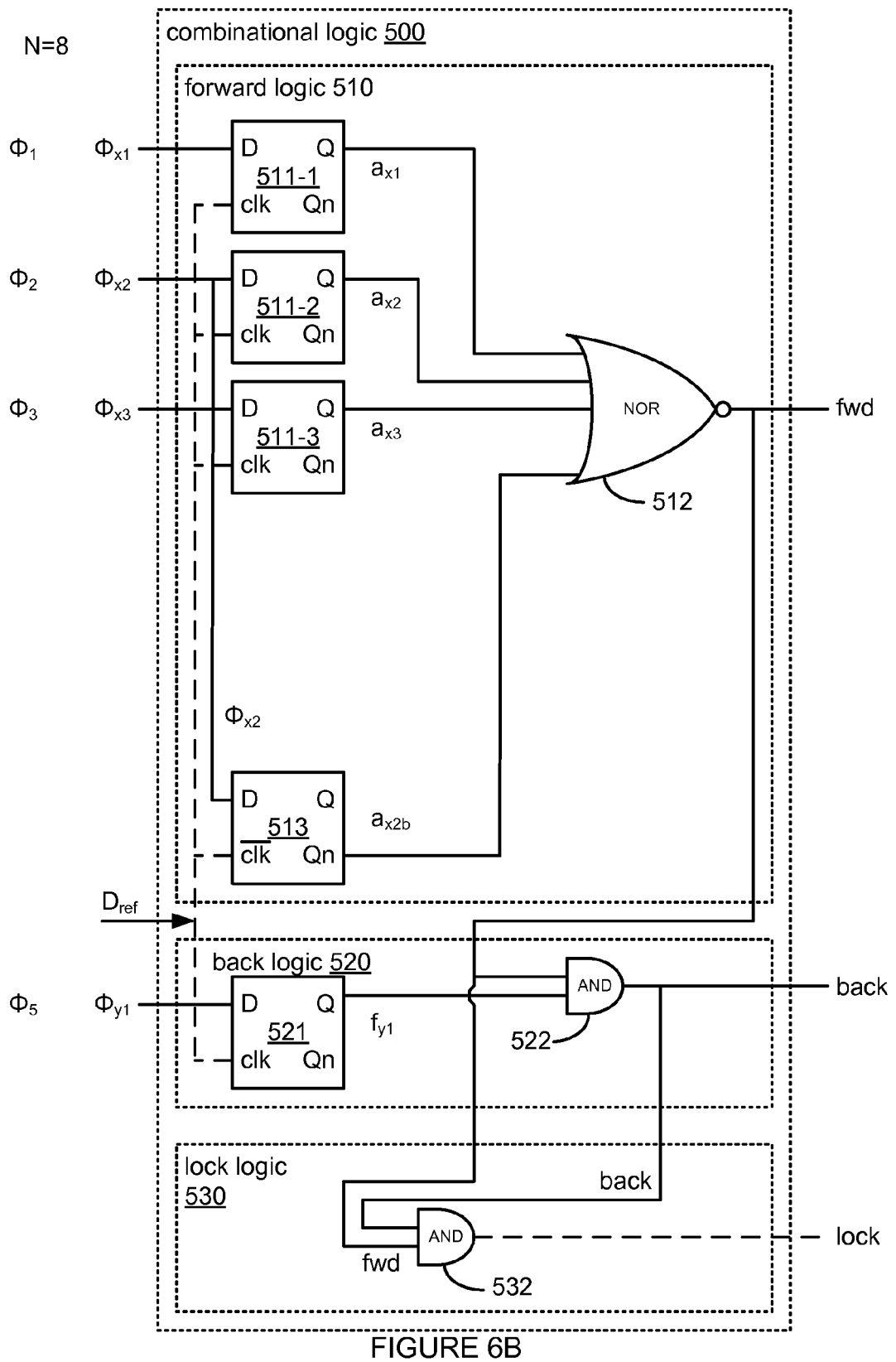

FIG. 6B shows combinational logic 500 for N=8. An N=8 DLL produces eight output signals $\{\Phi_1, \ldots, \Phi_8\}$, of which N−2 or fewer signals are provided to combinational logic 500. In the example shown, combinational logic 500 accepts four input signals (namely, $\Phi_1$, $\Phi_2$, $\Phi_3$ and $\Phi_5$) to generate forward, back and lock indicators. A forward indicator may be generated with three input signals (e.g., forward=($\Phi_{x1}$ NOR $\Phi_{x2}$ NOR $\Phi_{x3}$) where $\Phi_{x1}$, $\Phi_{x2}$, $\Phi_{x3}$=$\Phi_1$, $\Phi_2$, $\Phi_3$ respectfully); a back indicator may be set using the forward indicator and a single additional input signal (back=(forward AND $\Phi_{y1}$) wherein $\Phi_{y1}$=$\Phi_5$); and a lock indicator may be comprised of an AND operation between the forward and back indicators. D-FF 511-1, 511-2 and 511-3 may be used to condition $\Phi_{x1}$, $\Phi_{x2}$, $\Phi_{x3}$ prior to providing these signals to NOR gate 512.

Additionally, as initial condition protection, extra D-FF 513 may be included to accept one of the input signal supplied to forward logic 510 (e.g., $\Phi_{x2}$). Again, the additional D-FF 513 may be clocked on the opposite edge as D-FF 511-1, 511-2 and 511-3. An output signal $a_{x2b}$ of D-FF 513 may supply a fourth input signal to NOR gate 512. As with the N=4 case described above as well as with the examples below, back logic 520 includes a D-FF 521 to accept $\Phi_{y1}$ and produce $f_{y1}$ which is fed to an AND gate 522 along with the forward indicator to define the back indicator. Again, lock logic 530 includes an AND gate 532 that accepts both the forward and back indicators and provides the lock indicator as an output signal.

Figure 6C:
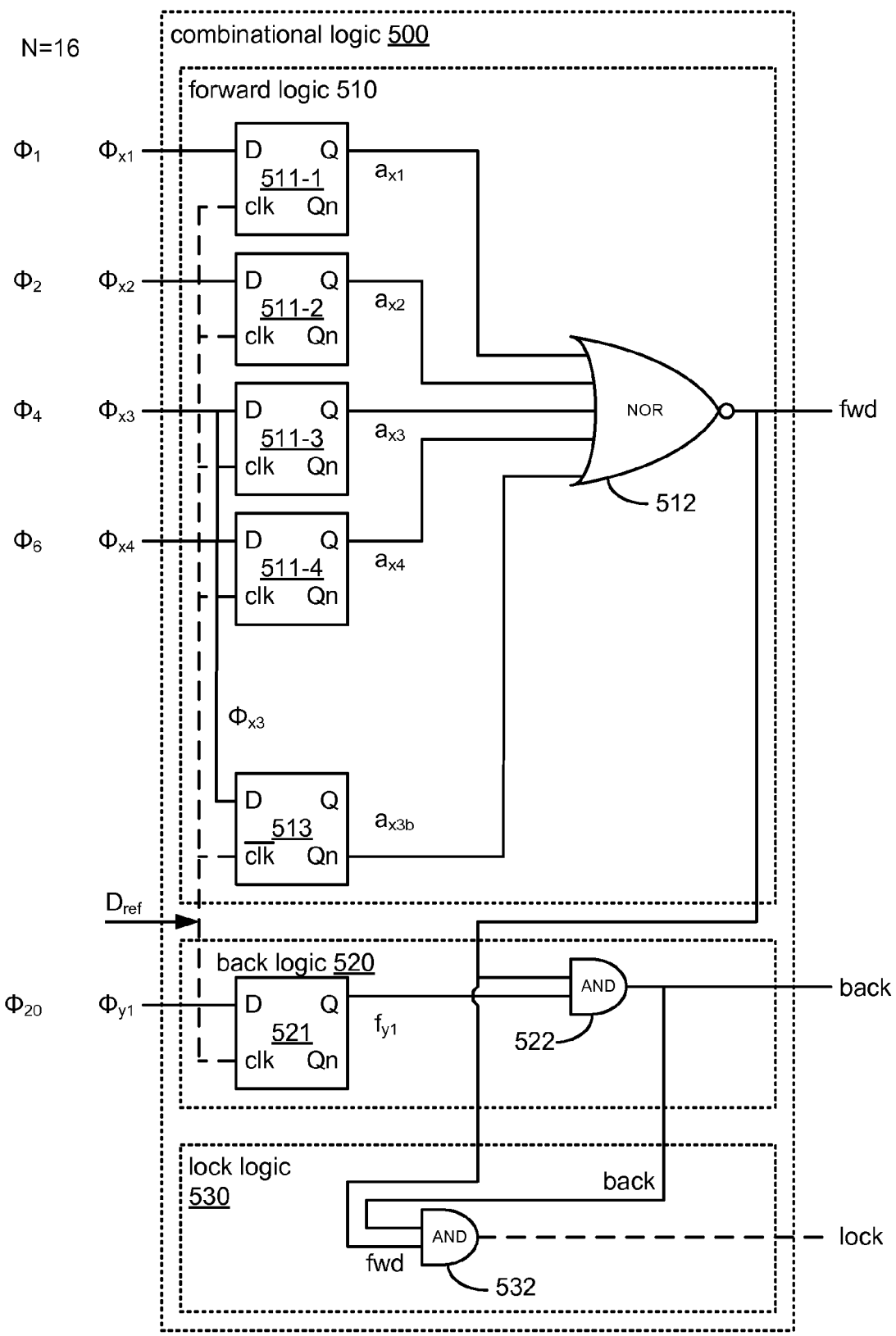

FIG. 6C shows combinational logic 500 for N=16. An N=16 DLL produces 16 output signals $\{\Phi_1, \ldots, \Phi_{16}\}$, of which N−2 or fewer signals are provided to combinational logic 500. In the example shown, combinational logic 500 accepts five input signals (namely, $\Phi_1$, $\Phi_2$, $\Phi_4$, $\Phi_6$ and $\Phi_{20}$) to generate forward, back and lock indicators. A forward indicator may be generated with four input signals (e.g., forward=($\Phi_{x1}$ NOR $\Phi_{x2}$ NOR $\Phi_{x3}$ NOR $\Phi_{x4}$) where $\Phi_{x1}$, $\Phi_{x2}$, $\Phi_{x3}$, $\Phi_{x4}$=$\Phi_1$, $\Phi_2$, $\Phi_4$, $\Phi_6$ respectfully); a back indicator may be set using the forward indicator and a single additional input signal (back=(forward AND $\Phi_{y1}$) wherein $\Phi_{y1}$=$\Phi_{20}$); and a lock indicator may be comprised of an AND operation between the forward and back indicators. Again, an extra D-FF 513 may be added to handle an unwanted initial condition. For example, $\Phi_{x3}$ may also be supplied to D-FF 513 and the output port Qb supplied to NOR gate 512.

Figure 6D:
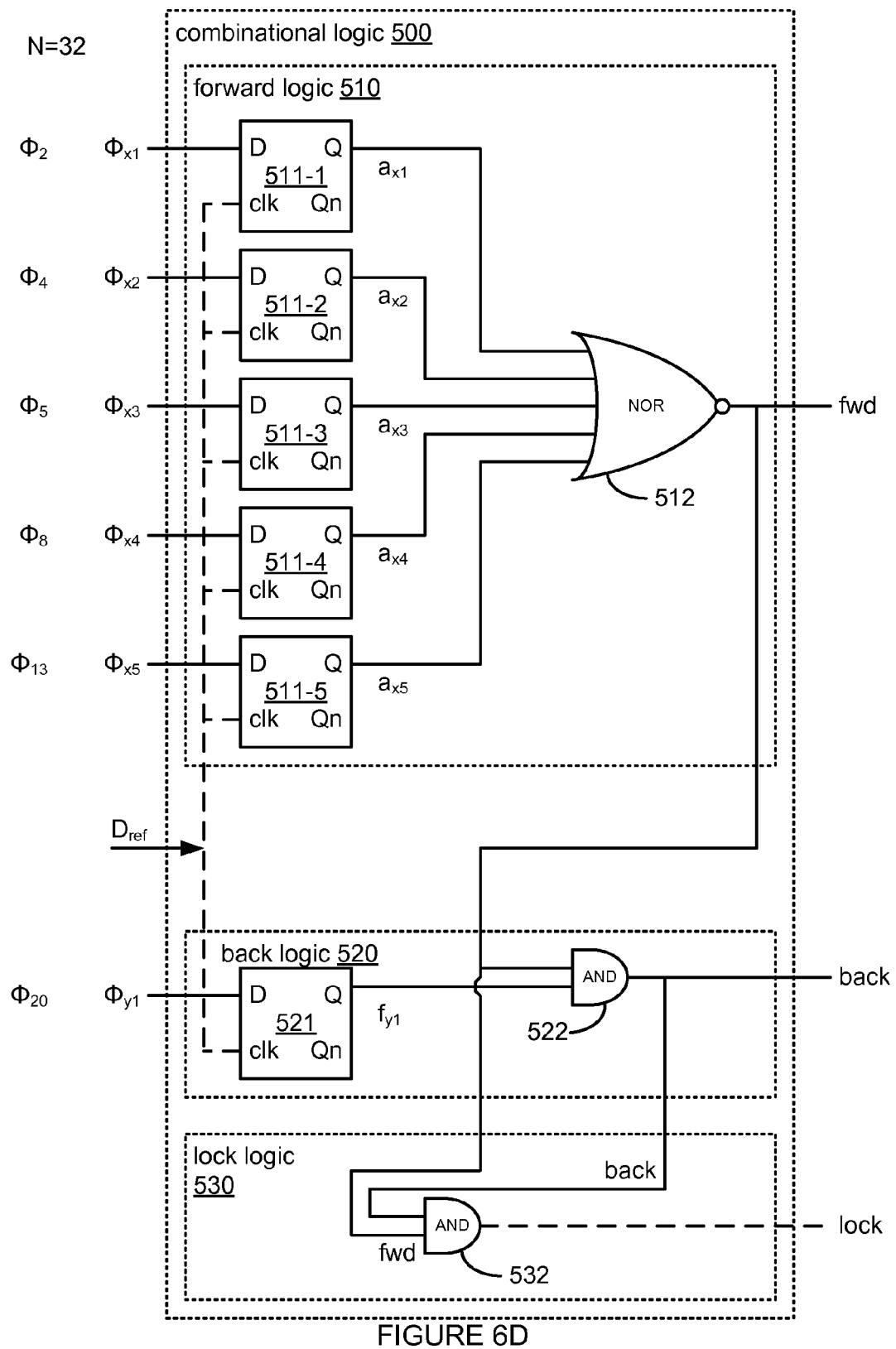

FIG. 6D shows combinational logic 500 for N=32. An N=32 DLL produces 32 output signals $\{\Phi_1, \ldots, \Phi_{32}\}$, of which N−2 or fewer signals are provided to combinational logic 500. In the example shown, combinational logic 500 accepts six input signals (namely, $\Phi_2$, $\Phi_4$, $\Phi_5$, $\Phi_8$, $\Phi_{13}$ and $\Phi_{20}$) to generate forward, back and lock indicators. A forward indicator may be generated with five input signals (e.g., forward=($\Phi_{x1}$ NOR $\Phi_{x2}$ NOR $\Phi_{x3}$ NOR $\Phi_{x4}$ NOR $\Phi_{x5}$) where $\Phi_{x1}$, $\Phi_{x2}$, $\Phi_{x3}$, $\Phi_{x4}$, $\Phi_{x5}$=$\Phi_2$, $\Phi_4$, $\Phi_5$, $\Phi_8$, $\Phi_{13}$ respectfully); a back indicator may be set using the forward indicator and a single additional input signal (back=(forward AND $\Phi_{y1}$) wherein $\Phi_{y1}$=$\Phi_{20}$); and a lock indicator may be comprised of an AND operation between the forward and back indicators.

In the N=32 example shown, from 32 signals $\{\Phi_1, \Phi_2, \Phi_3, \ldots, \Phi_{31}, \Phi_{32}\}$, a subset of six signals (e.g., $\{\Phi_{x1}, \Phi_{x2}, \Phi_{x3}, \Phi_{x4}, \Phi_{x5}, \Phi_{y1}\}$=$\{\Phi_2, \Phi_4, \Phi_5, \Phi_8, \Phi_{13}, \Phi_{20}\}$) may comprise the subset. Each of the delayed clock signals from the subset may be clocked into a respective D-FF 511-1, 511-2, 511-3, 511-4, 511-5, 521 where the input signal at gate 'D' may be clocked to produce output signals Q and Qn by the rising edge of the reference clock $D_{ref}$.

In forward logic 510 for the example above having 32 delayed clock signals, a forward indicator may be generated as a NOR operation 512 of delayed clock signals $\{\Phi_2, \Phi_4, \Phi_5, \Phi_8, \Phi_{13}\}$. Each of the delayed clock signals from the subset may be conditioned through a respective D-FF 511-1 . . . 511-5 where each D-FF 511-i is clocked on the positive edge of the reference signal ($D_{ref}$=$\Phi_0$). Output signals Q (labeled $a_{x1}$, $a_{x2}$, $a_{x3}$, $a_{x4}$ & $a_{x5}$) are applied to the input terminals of NOR gate 512. The output port of NOR gate 512 may be supplied as the forward indicator.

In back logic 520, a back indicator may be generated as an AND operation from AND gate 522 between the forward indicator and delayed clock signal $\Phi_{y1}$. For the example above generating N=32 delayed clock signals, $\Phi_{y1}$ is $\Phi_{20}$. In lock logic 530, a lock indicator may be generated as an AND operation using AND gate 532 between the forward and back indicators.

Figure 6E:
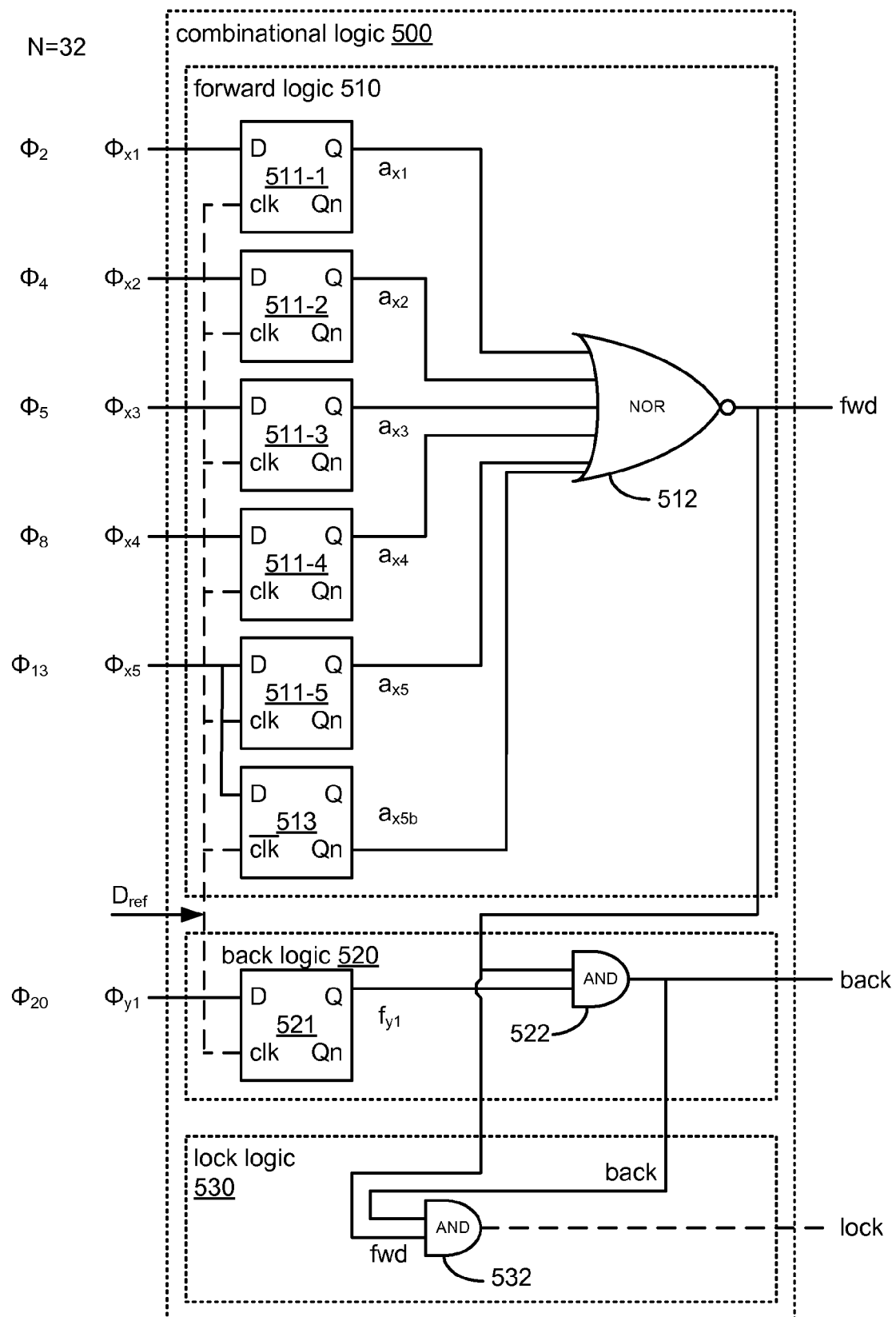

FIG. 6E shows the circuitry of FIG. 6D with the addition of D-FF 513. D-FF 513 has the same input signals as D-FF 511-5 however its clock is negative-edge triggered and the complement signal Qn (labeled $a_{x5b}$) is fed to NOR gate 512. During an initial startup period, all input signals to NOR gate 512 from D-FFs 511 and 512 may be zero resulting in a forward indicator of '1', thus the DLL takes no forward action. During post-startup operation, the Qn output signal of D-FF 513 may be considered a half-period (T/2) delayed version of the Q output of D-FF 511-5. D-FF 513 therefore protects against a false forward indicator as the DLL is starting up but does not adversely effect operation after startup.

Figure 7A:
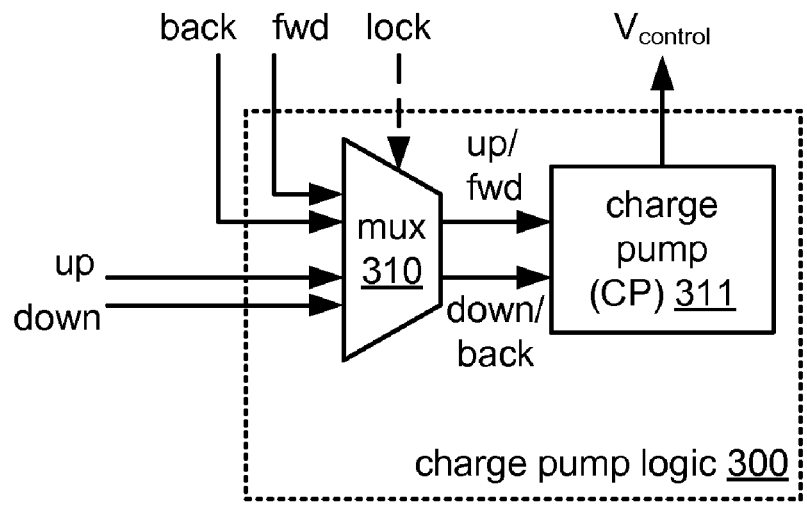
FIGS. 7A, 7B, 8A and 8B show embodiments of charge pump logic for the DLL of FIG. 4 in accordance with the present invention.

FIGS. 7A, 7B, 8A and 8B show embodiments of charge pump logic 300 for the DLL of FIG. 4. Charge pump logic 300 may include a single charge pump or may include multiple charge pumps. A first embodiment includes a multiplexer 310 and a single charge pump (CP) 311 as shown in FIG. 7A. Mux 310 accepts down/up indicators as data input signals from PD 200 of FIG. 4. Mux 310 also accepts back/forward indicators as data input signals and the lock indicator as a selection input signal from combinational logic 500 of FIG. 4. Base on the value of the lock indicator, mux 310 passes either the down/up pair or the back/forward pair to charge pump 311. CP 311 then adjusts its output control signal $V_{control}$ as directed by the indicators provided by mux 310.

Figure 7B:
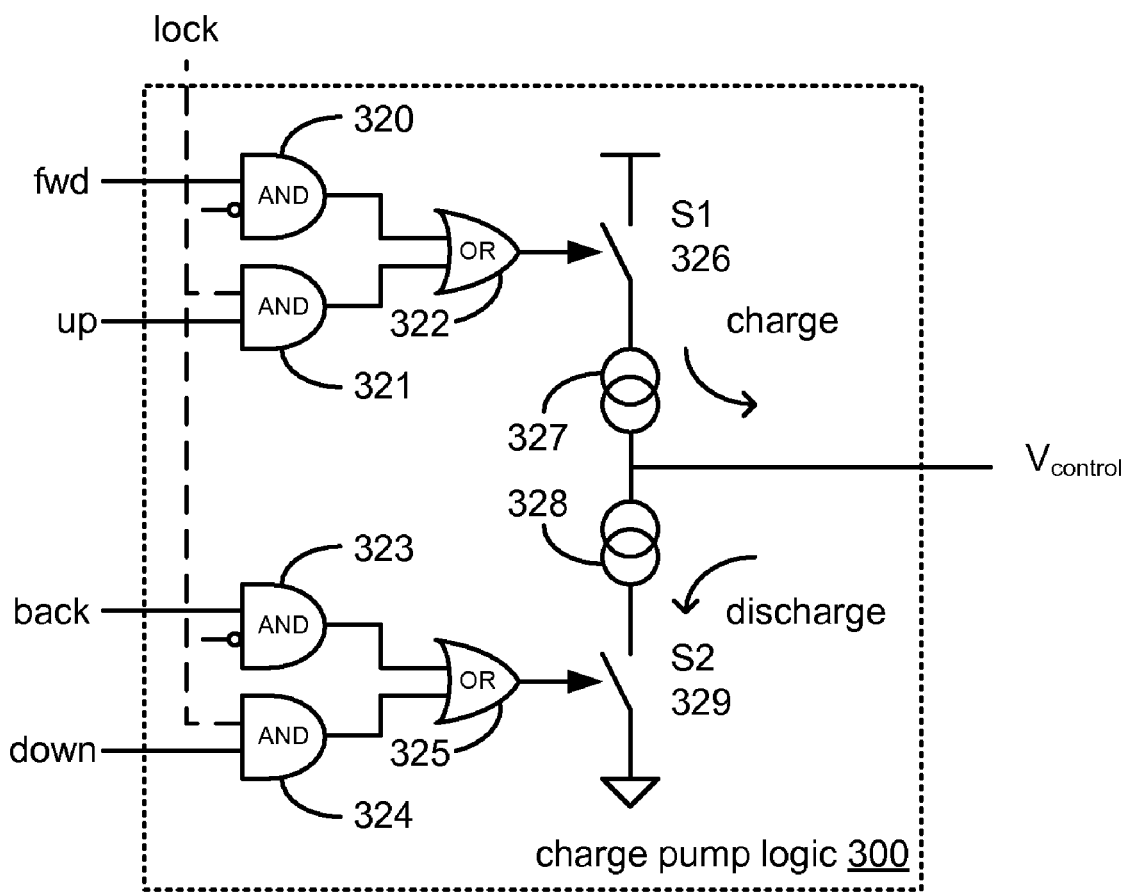

In a second embodiment shown in FIG. 7B, the function of mux 310 of FIG. 7A is implemented with logical gates 320-325 and the function of charge pump 311 of FIG. 7A is implemented with switches 326, 329 and current sources 327, 328. The first switch (S1) 326 is controlled by an output signal from an OR gate 322 having two input ports fed by the output ports of two AND gates 320, 321. The first AND gate 320 accepts the forward indicator as a first input signal and an inverse of the lock indicator as a second input signal. The second AND gate 321 accepts the up indicator as a first input signal and the lock indicator as a second input signal. As implemented, a value of '1' for the up or forward indicators along with the appropriate lock indicator means action (charging the charge pump to increase the control signal to shorten the delay time) and a value of '0' for the up and forward indicators means inaction. The lock indicator is used to pass either the up or forward indicator. A lock indicator of '0' passes the forward indicator from AND gate 320 to OR gate 322 and a lock indicator of '1' passes the up indicator from AND gate 321 to OR gate 322.

Similarly, the second switch (S2) 329 is controlled by an output port from an OR gate 325 having two input ports fed by the output ports of two AND gates 323, 324. The third AND gate 323 accepts the back indicator as a first input signal and an inverse of the lock indicator as a second input signal. The forth AND gate 324 accepts the down indicator as a first input signal and the lock indicator as a second input signal. As implemented, a value of '1' for the down or back indicators means action (discharging the charge pump to decrease the control signal to increase the delay time) and a value of '0' for the down and back indicators means inaction. The lock indicator is used to pass one of the two down and back indicators. A lock indicator of '0' passes the back indicator from AND gate 323 to OR gate 325 and a lock indicator of '1' passes the down indicator from AND gate 324 to OR gate 325.

Figure 8A:
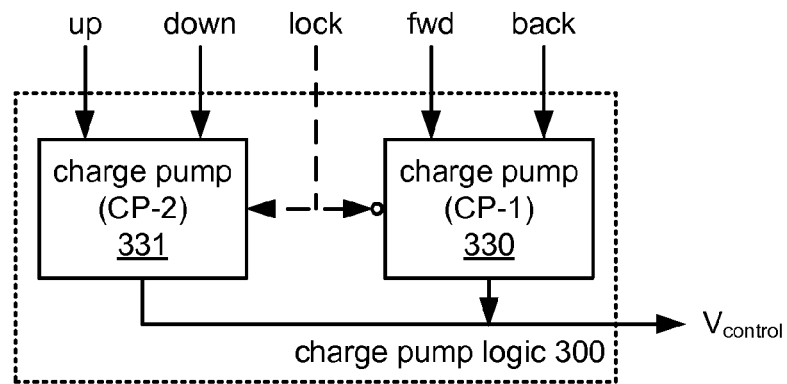

In a third embodiment shown in FIG. 8A, charge pump logic 300 is implemented with multiple charge pumps 330, 331. A control signal $V_{control}$ is driven from either charge pump 330, 331. The first charge pump (CP-1) 330 may be active for a first value of the lock indicator while the second charge pump (CP-2) 331 may be active for a complement value of the lock indicator. For example, when combinational logic 500 determines that the DLL is out of a lock state, the lock indicator instructs charge pump logic 300 to activate CP-1 330, thereby responding to the back and forward indicators from combinational logic 500 of FIG. 4. When combinational logic 500 determines that the DLL is in a lock state, the lock indicator instructs charge pump logic 300 to activate CP-2 331, thereby responding to the up and down indicators from phase detector 200.

Charge pump logic including multiple charge pumps may advantageously use a first charge pump that has a high current for charging and discharging for initial acquisition or out-of-lock periods. A second charge pump having lower current for charging and discharging may be used for tracking purposes and for making subtle changes to the control signal.

Figure 8B:
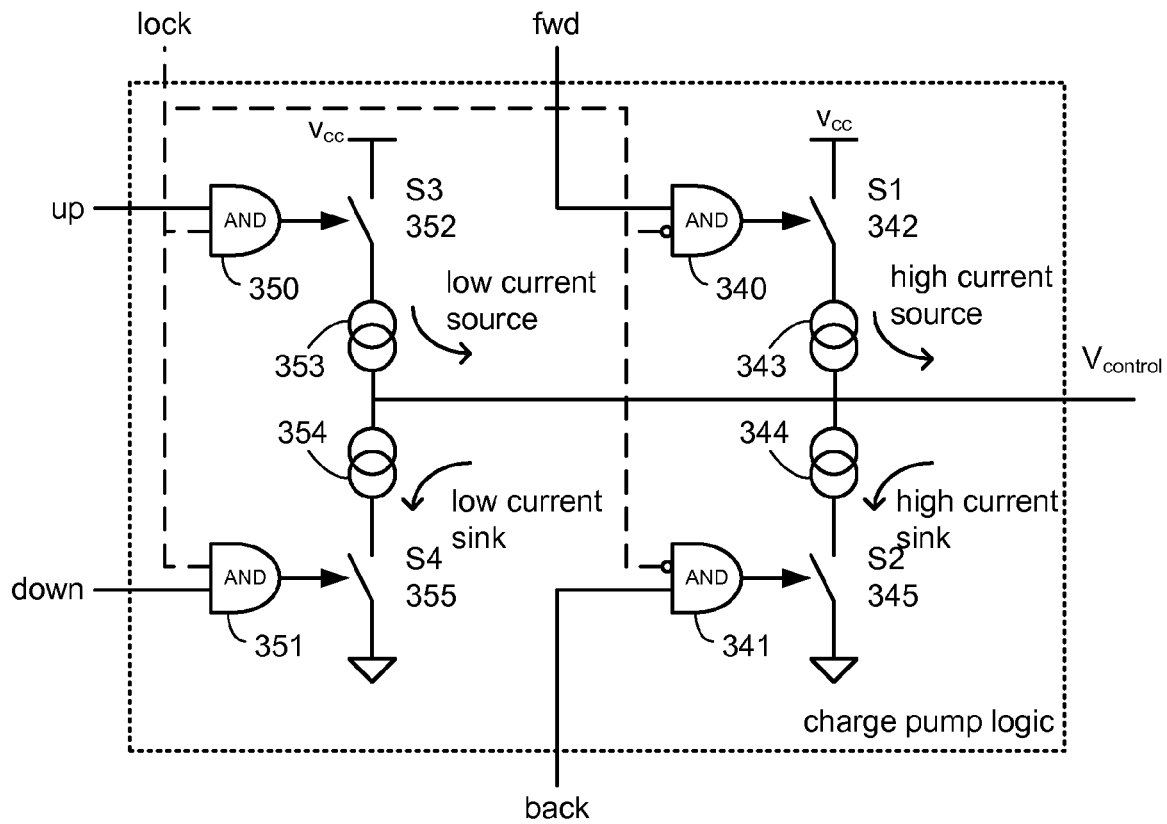

In a fourth embodiment shown in FIG. 8B, two charge pumps work together to set a control signal $V_{control}$ where the first charge pump has higher charging/discharging currents than the second charge pump. For example, a first charge pump may source and sink a current of 30 uA where a second charge pump may source and sink a current of 3 uA (or approximately 10% of the first charge pump). A first charge pump includes an AND gate 340 accepting the forward indicator and a complement of the lock indicator as input signals and provides a control signal to a first switch (S1) 342. When closed switch S1 342 completes a circuit to allow a current source 343 the ability to source a high current to charge the capacitor of filter 400 of FIG. 4. As the capacitor charges the control signal $V_{control}$ increases thereby increasing the control current $I_{control}$ resulting in a shorter the delay period Δt. When open switch S1 342 disables charging from the first charge pump. The first charge pump also include a second AND gate 341 accepting the back indicator and the complement of the lock indicator as input signals and provides a control signal to a second switch (S2) 345. When closed S2 345 completes the circuit to allow a current source 345 the ability to sink a high current to discharge the capacitor of filter 400 of FIG. 4 thus lowering the control signal $V_{control}$ and decreasing the control current $I_{control}$ resulting in a longer the delay period Δt. When open switch S2 345 disables discharging from the first charge pump.

The second charge pump of FIG. 8B includes similar circuitry however the charge and discharge currents of the second charge pump are lower than that of the first charge pump. The second charge pump includes an AND gate 350 accepting the up indicator and the lock indicator as input signals and provides a control signal to a third switch (S3) 352. When closed switch S3 352 completes the circuit to allow a current source 353 providing a low current source to charge the capacitor of filter 400 of FIG. 4. When open switch S3 352 disables charging from the second charge pump. The second charge pump also include a second AND gate 351 accepting the down indicator and the lock indicator as input signals and provides a control signal to a fourth switch (S4) 355. When closed S4 355 completes the circuit to allow a current source 355 the ability to sink a low current to discharge the capacitor of filter 400 of FIG. 4 thus lowering the control signal $V_{control}$ and lengthening the delay period Δt.

Figure 9:
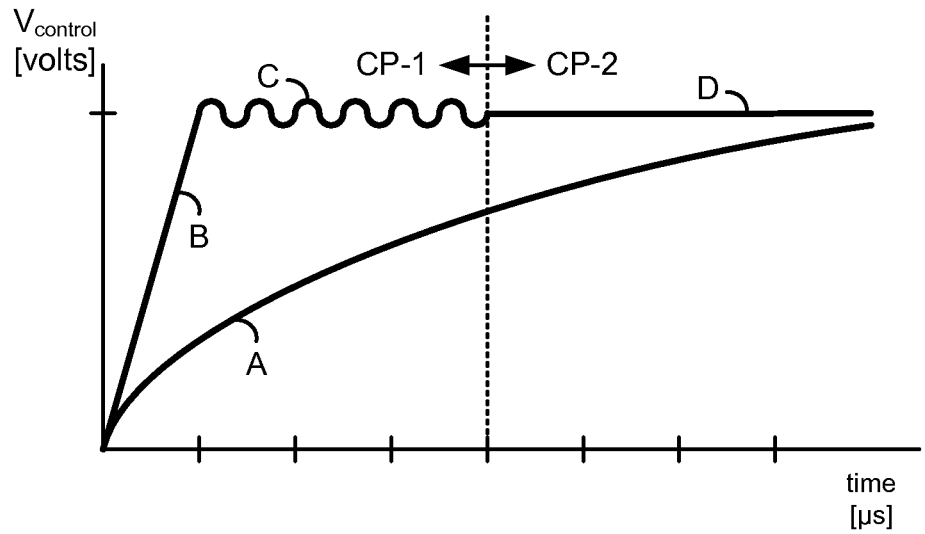
FIG. 9 illustrates charge curves associated with both single and double charge pump logic in accordance with the present invention.

FIG. 9 illustrates expected charge curves associated with both single and double charge pump logic. A first curve (segment 'A') shows a control signal $V_{control}$ associated with charge pump logic having a single charge pump. It is expected that a single charge pump sourcing and sinking a low current would take several microseconds to charge (or discharge) the control signal $V_{control}$ to an appropriate value.

Advantageously, charge pump logic having multiple charge pumps with different charging/discharging currents may be used to aggressively set the control signal during an initial acquisition period. Once the control signal is within a particular range, a less aggressive charge pump may be used for more controlled honing. A second curve shows an initial acquisition stage (segment 'B'), a ripping stage (segment 'C') and an acquired stage (segment 'D'). During the initial acquisition stage (segment 'B'), a first charge pump aggressively and rapidly charges a capacitor to set the control signal. During the ripping stage (segment 'C'), the first charge pump's aggressive nature results in overshooting and undershooting a target value. At some point in time (shown as a dotted line), the combination logic determines that the DLL is in a locked state. At this time, the combination logic 500 provides an updated lock indicator to the charge pump logic 300, which switches from driving the control signal with the high current first charge pump to the lower current second charge pump, as shown with segment 'D'.

Figure 10:
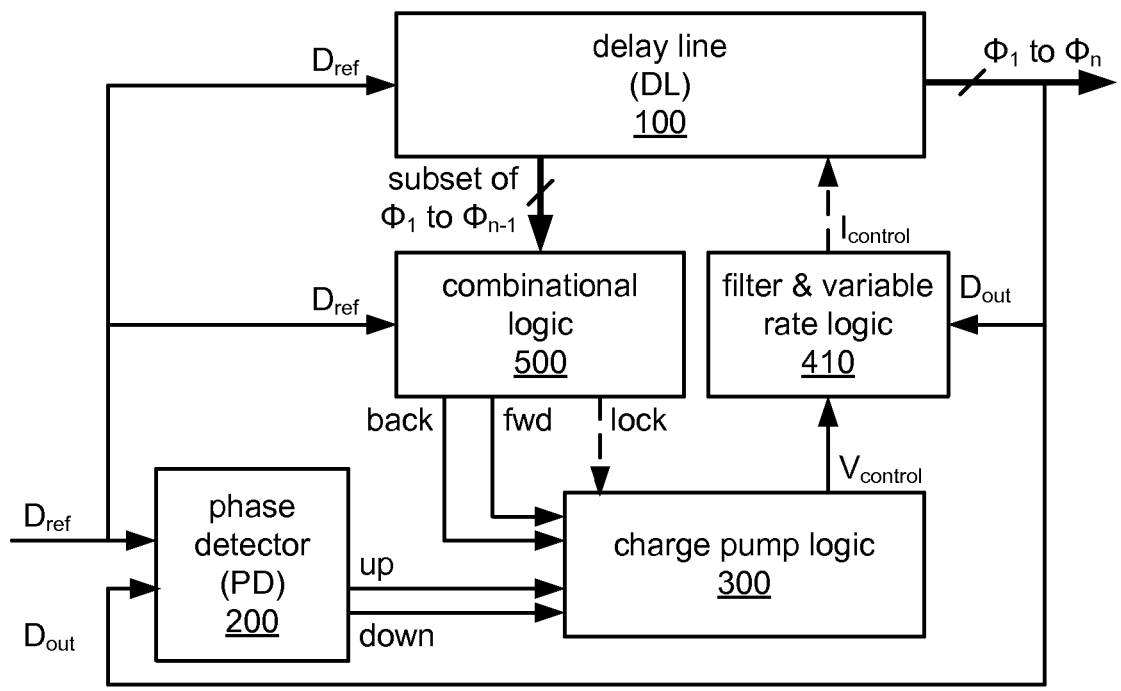
FIG. 10 shows another DLL in accordance with the present invention.

FIG. 10 shows another DLL in accordance with the present invention. Filter 400 of FIG. 4 is shown replaced with a filter and variable rate logic 410. Variable rate logic provides higher sensitivity when making fine adjustments to the control signal to the delay line. Additionally, rather than providing a voltage control signal $V_{control}$, logic 410 provides a current control signal $I_{control}$ to a current controlled delay line (DL) 100. Logic 410 is described further below with respect to the remaining figures.

Figure 11A:
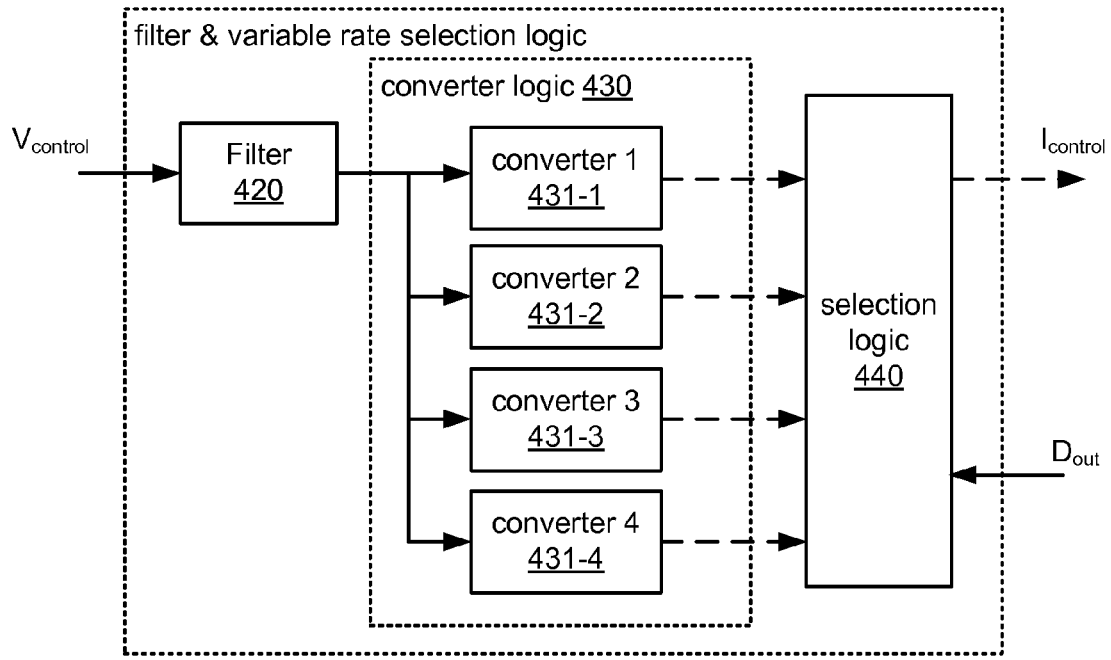

FIGS. 11A, 11B and 12A through 12F show circuitry associated with the DLL of FIG. 10. FIG. 11A shows a filter and variable rate logic 410 including a filter 420 (such as the capacitive filter 40 of FIG. 1C), converter logic 430 and selection logic 440. Converter logic 430 may provide multiple voltage-to-current converters (V2I) resulting in corresponding voltage-to-delay curves such as provided by the four converters 431-1 to 431-4 shown. Each converter may operate in a different range of delays for a given range of input voltages. Each converter may be used to convert the incoming voltage control signal to a current signal thus resulting in a corresponding delay. Selection logic 440 may be used to select one control signal from the multiple converters and provide this selected control signal to the delay line.

Figure 11B:
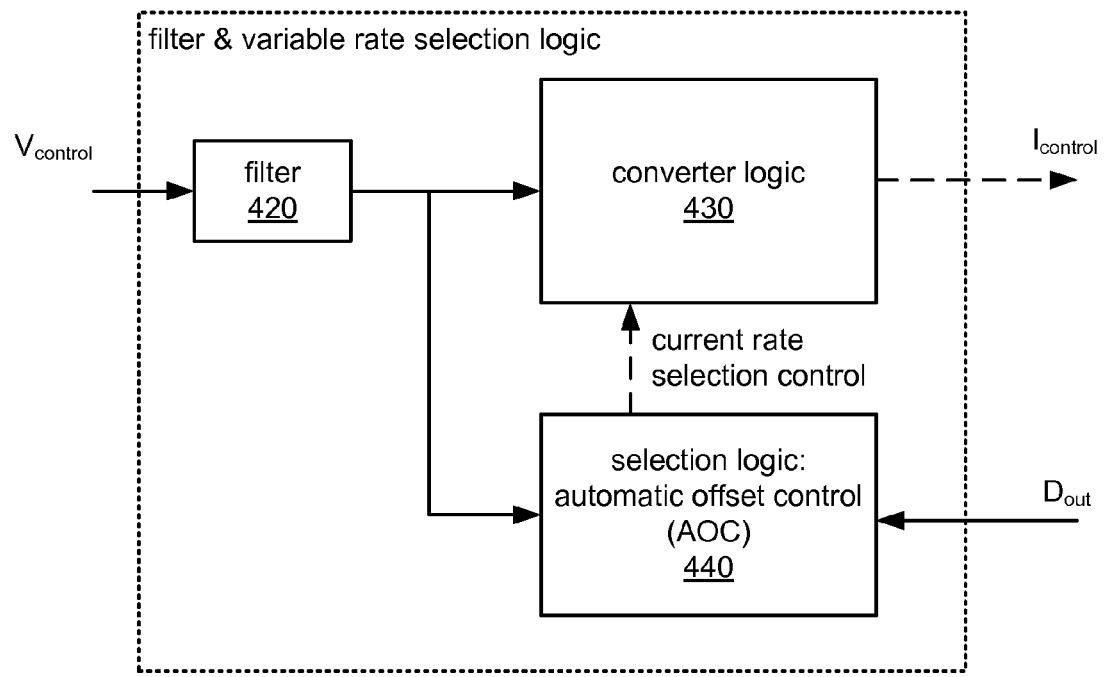

FIG. 11B shows an alternative embodiment of logic 410 including a filter 420, converter logic 430 and selection logic 440. In this embodiment, converter logic 430 includes a single voltage-to-current converter (V2I) having multiple conversion characteristics from which to select. The characteristic may be which conversion function to apply where each conversion function provides a different conversion between an input voltage and a output current. To select one of the conversion functions, selection logic 440 may be used, for example, by using automatic offset control (AOC) circuitry or the like described below.

FIG. 12A shows an example AOC circuit 440 of FIG. 11B. The AOC 440 shown includes comparator logic 441, a two-bit decoder 442, adder/subtractor logic 443 and a counter 444. Comparator logic 441 provides first and second indicators T0 and T1. When $V_{control}$ is too high, that is, above an upper limit, then T0 and T1 are both '1'. When $V_{control}$ is too low, that is, below a lower limit, then T0 and T1 are both '0'. When $V_{control}$ is with a proper range, that is, between the upper and lower limits, then T0='1' and T1='0'. Indicators T0 and T1 are provided to two-bit decoder 442, which produces two control bits C0 and C1. Control bits C0 and C1 are provided as controls to adder/subtractor logic 443. Adder/subtractor logic 443 increments or decrements an internal value each period defined by counter 444. Counter 444 may be clocked by the input clock signals ($D_{in}$ or $D_{ref}$) or by one of the output delayed clock signals {$\Phi_1$, $\Phi_2$, $\Phi_3$, ..., $\Phi_{n-1}$, $\Phi_n = D_{in}$} or similar signal. Once counter 444 reaches a predetermined value, counter 444 provides a clocking signal to activate logic 443. The resulting output signal or adder/subtractor logic 443 is shown as B0' and B1', which may be provided to converter logic 430 as current rate selection control signals of FIG. 11B. Alternatively, the resulting functionality of AOC 440 may be provided in any of a number of ways known by those skilled in the art.

FIG. 12B shows a embodiment of comparator logic 441 includes a voltage divider circuit providing a fixed upper limit voltage value $V_1$ as an input signal to a first comparator and a lower limit voltage value $V_2$ as an input signal to a second comparator. The variable control voltage $V_{control}$ is supplied as a second input signal to each comparator. To reduce the number of changes to comparison output values, comparators having a hysteresis may be used. For example, a first comparator may operate about $V_1$=1.45 volts+/−0.05 volts and a second comparator may operate about $V_2$=0.70 volts+/−0.05 volts.

FIG. 12C shows a conversion between input signals T0/T1 and output signals C0/C1 of two-bit decoder 442. When the control voltage $V_{control}$ is too high, both T0 and T1 are '1' and thus a lower delay curve should be used. Output signals of C0='0' and C1='1' enables the subtractor in logic 443 to decrement to a lower delay curve by changing B0' and B1'. When the control voltage $V_{control}$ is between the upper and lower limits, T0 is '1' and T1 is '0' and no change is made. In an initial condition (i.e.), T0 may be '0' and T1 may be '1' and therefore the adder is enabled. When the control voltage $V_{control}$ is too low, both T0 and T1 are '0' and thus a higher delay curve should be used. Output signals of C0='1' and C1='0' enables the adder in logic 443 to increment to a higher delay curve by changing B0' and B1'.

Figures 12D, 12E, 12F:
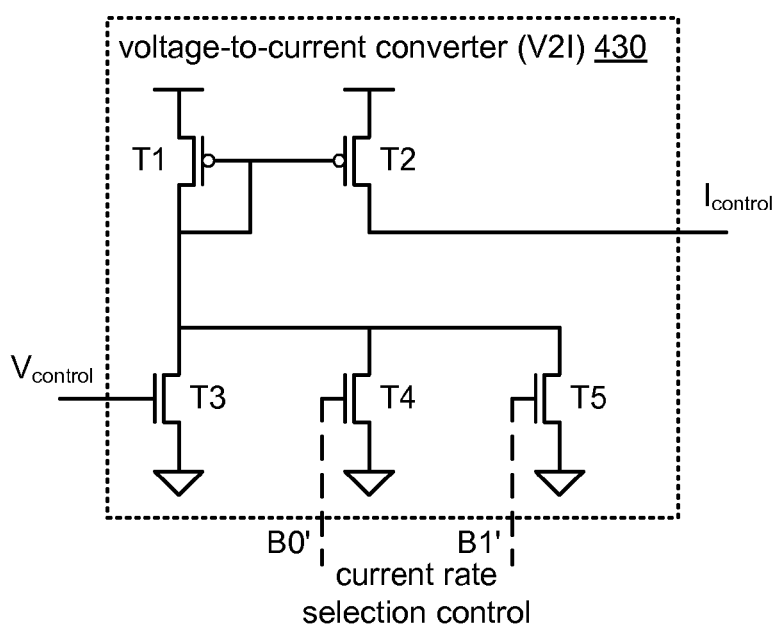

FIGS. 12D and 12E show respective past and next output values for an adder and a subtractor, respectively, in logic 443. When the subtractor in logic 443 is enabled, a lower next value is produced until a floor value is reached. Similarly, when the adder in logic 443 is enabled, a higher next value is produced until a ceiling value is reached.

FIG. 12F shows a circuit diagram for a converter 430 providing multiple delay curves. The circuit includes mirrored transistors T1 and T2 as well as a transistor T3 used to sink current. To sink additional current, transistors T4 and T5 may separately or jointly be enabled with control bits B0' and B1'. Transistor T3 sinks a nominal current while the addition of enabled transistors T4 and T5 may substantially increase the current driven by T2. Thus, four different delay curves are realized based on which combination of B0' and B1' are enabled. A resulting current control $I_{control}$ may be supplied to delay line 100.

Figure 13A:
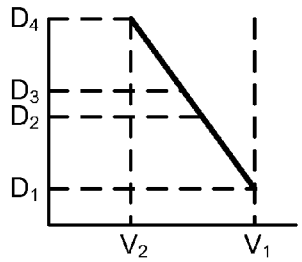
FIGS. 13A through 13C illustrate a voltage-to-delay conversion curves associated with the DLL of FIG. 10 in accordance with the present invention.
Figure 13B:
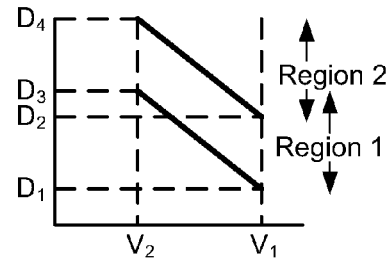
Figure 13C:
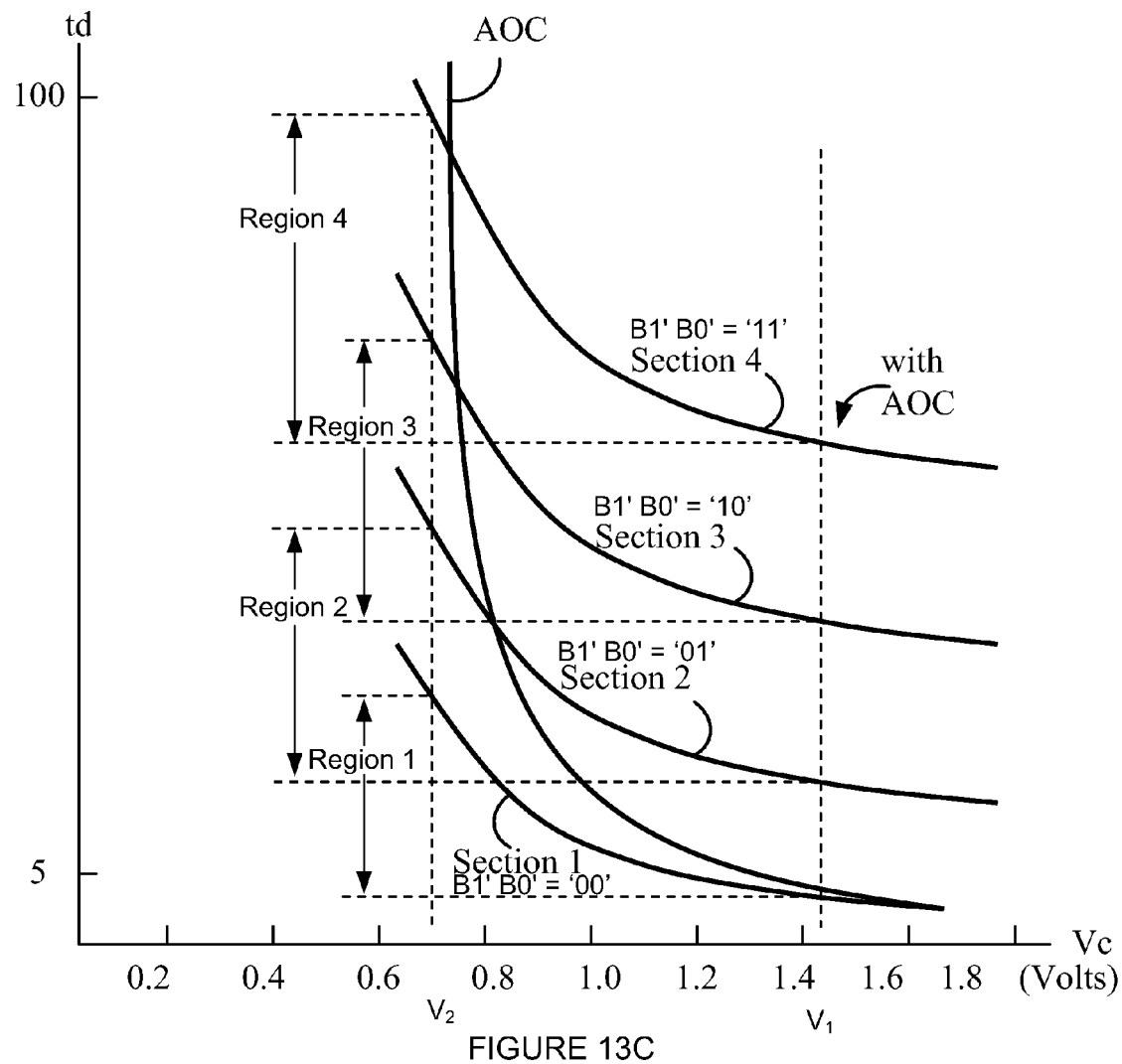

FIGS. 13A through 13C illustrate a voltage-to-delay conversion curves associated with the DLL of FIG. 10. A first voltage-to-delay conversion curve is shown in FIG. 13A. A conventional single delay curve provides a one-to-one conversion between an input voltage and an output delay. For example, voltage values between $V_1$ and $V_2$ produce corresponding delays between $D_1$ and $D_4$.

In a dual-curve conversion system shown in FIG. 13B, either of two different delay curves may be selected. When operating in a first region, input voltage values between $V_1$ and $V_2$ produce delay values between $D_1$ and $D_3$ and when operating in a second region, input voltage values between $V_1$ and $V_2$ produce delay values between $D_2$ and $D_4$. Overlapping output regions provide delays between $D_2$ and $D_3$ and allow for hysteresis during operation. Having multiple delay curves allows a converter to more finely adjust the delay for a given change in voltage.

FIG. 13C shows a four-curve converter compared to a single curved converter. A converter may provide a conversion between input voltage and delay as shown with the curve labeled "without AOC". For voltage values near $V_2$, the delay output (i.e., the resulting delay line delay) is hypersensitive to small variations in input voltage. To reduce this hypersensitivity, the single mode converter may be replaced with a multi-delay mode converter. For example, a four-delay curve converter may be used. Based on values B0' and B1', the converter operates along one of the four curves. When B1' B0' equal '00', the converter operates along the curve identified as section 1. When B1' B0' equal '01', the converter operates along the curve identified as section 2. When B1' B0' equal '10', the converter operates along the curve identified as section 3. When B1' B0' equal '11', the converter operates along the curve identified as section 4. The resulting converter operates with greater control at values closer to $V_2$ than the converter without AOC control.

The description above provides various hardware embodiments of the present invention. The invention may also be performed as a method or sequence of overlapping and/or non-overlapping steps. For example, a method in a DLL to produce a plurality of delayed clock signals {$\Phi_1$, $\Phi_2$, $\Phi_3$, ..., $\Phi_{n-1}$, $\Phi_n$} wherein each pair (i.e., $\Phi_j$ & $\Phi_{j+1}$ for j=1 to n−1) of N sequential clock signals {$\Phi_1$, $\Phi_2$, $\Phi_3$, ..., $\Phi_{n-1}$, $\Phi_n$}, forms a common delay period ($\Delta t$), may comprises one or more of the unordered steps of: setting the delay period $\Delta t$ to an initial delay period ($\Delta t_{initial}$); generating the plurality of delayed clock signals having a delay period $\Delta t$ based on an input reference signal (e.g., $D_{ref}$); generating back and forward indicators based on a subset of the plurality of delayed clock signals, wherein a total count of signals in the subset comprises a total subset value of N−2 or fewer signals; and providing the back and forward indicators to charge pump logic. The method may further comprise generating a lock indicator based on the subset of the plurality of delayed clock signals; and/or selecting a conversion characteristic from a plurality of conversion characteristics (e.g., based on B0' and B1' as describe above; converting a control signal from the charge pump logic to a delay line control signal based on the selected conversion characteristic; and/or providing the delay line control signal to a delay line.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art. Therefore, it should be understood that the invention can be practiced with modification and alteration within the spirit and scope of the claims. The description is not intended to be exhaustive or to limit the invention to the precise form disclosed. Furthermore, it should be understood that the invention can be practiced with modification and alteration.

What is claimed is:

1. A delay-locked loop (DLL) to produce a plurality of delayed clock signals wherein each pair of sequential clock signals forms a common delay period ($\Delta t$), the DLL comprising:
   combinational logic comprising:
      an input port to accept a subset of the plurality of delayed clock signals wherein a total count of the plurality of delayed clock signals comprises a total value N and a total count of signals in the subset comprises a total subset value of N-2 or fewer signals;
      forward logic to provide a forward indicator, wherein the forward indicator indicates the delay period ($\Delta t$) is longer than a desired delay period;
      back logic to provide a back indicator, wherein the back indicator indicates the delay period ($\Delta t$) is shorter than a desired delay period;
      lock logic to provide a lock indicator, wherein the lock indicator validates at least one of the forward and back indicators; and
      an output port to provide the forward, back and lock indicators.

2. The DLL of claim 1, further comprising:
   a delay line comprising:
      a first input port to accept a source signal ($D_{ref}$);
      a second input port to accept a delay line control signal wherein the delay line control signal effects a duration of the delay period ($\Delta t$); and
      an output port to provide the plurality of delayed clock signals;
      wherein the delay line provides the subset of the plurality of delayed clock signals to the combinational logic.

3. The DLL of claim 2, wherein the delay line comprises a differential delay line including the plurality of delayed clock signals.

4. The DLL of claim 1, further comprising:
   a phase detector comprising:
      a first input port to accept a source signal ($D_{ref}$);
      a second input port to accept one of the plurality of delayed clock signals; and
      an output port to provide up and down indicators wherein the up indicator indicates the delay period ($\Delta t$) is longer than a desired delay period, and wherein the down indicator indicates the delay period ($\Delta t$) is shorter than a desired delay period.

5. The DLL of claim 4, further comprising:
   charge pump logic comprising:
      a first charge pump;
      a first input port coupled to the output port of the combinational logic;
      a second input port coupled to the output port of the phase detector; and
      a control signal wherein the control signal is adapted to adjust the delay period ($\Delta t$);
      wherein an input port of the first charge pump is coupled to at least one of the output port of the combinational logic and the output port of the phase detector.

6. The DLL of claim 5, wherein the charge pump logic further comprises a second charge pump, wherein an input port of the second charge pump is coupled to at least the other one of the output port of the combinational logic and the output port of the phase detector.

7. The DLL of claim 6, wherein charge/discharge currents of the first charge pump is greater than charge/discharge currents of the second charge pump.

8. The DLL of claim 6, further comprising:
   a filter comprising a capacitive element to hold the control signal from the charge pump logic.

9. The DLL of claim 1, wherein the forward logic includes logic to account for an initial condition.

10. The DLL of claim 1, further comprising:
    variable rate selection logic comprising:
       converter logic to convert a control signal from charge pump logic to a delay line control signal, wherein the converter logic has a plurality of conversion characteristics; and
       selection logic to provide the control signal operated on by a selected one of the plurality of conversion characteristics.

11. The DLL of claim 1, wherein at least one pair of sequential clock signals in the subset forms a delay period different from the delay period ($\Delta t$).

12. The DLL of claim 1, wherein the total subset value is less than half of the total value N.

13. The DLL of claim 1, wherein the subset excludes $\Phi_{n-1}$ and $\Phi_n$.

14. The DLL of claim 1, wherein the subset of the plurality of delayed clock signals comprises six or fewer signals and N is at least 16.

15. The DLL of claim 14, wherein the six or fewer signals comprise signals $\{\Phi_2, \Phi_4, \Phi_5, \Phi_8, \Phi_{13}, \Phi_{20}\}$.

16. The DLL of claim 14, wherein the plurality of delayed clock signals comprises N=32 signals $\{\Phi_1, \Phi_2, \Phi_3, \ldots, \Phi_{31}, \Phi_{32}\}$.

17. The DLL of claim 14, wherein
   the forward indicator comprises a NOR operation of $\Phi_2$, $\Phi_4$, $\Phi_5$, $\Phi_8$ and $\Phi_{13}$;
   the back indicator comprises an AND operation of the forward indicator and $\Phi_{20}$; and
   the lock indicator comprises an AND operation of the forward indicator and back indicator.

18. A delay-locked loop (DLL) for producing a plurality of delayed clock signals wherein each pair of sequential clock signals forms a common delay period ($\Delta t$), the DLL comprising:
    combinational logic comprising:
       an input port to accept a subset of the plurality of delayed clock signals wherein a total count of the plurality of delayed clock signals comprises a total value N and a total count of signals in the subset comprises a total subset value of N-2 or fewer signals, and wherein at least one pair of sequential clock signals in the subset forms a delay period different from the delay period ($\Delta t$);

forward logic to provide a forward indicator, wherein the forward indicator indicates the delay period ($\Delta t$) is longer than a desired delay period;

back logic to provide a back indicator, wherein the back indicator indicates the delay period ($\Delta t$) is shorter than a desired delay period;

lock logic to provide a lock indicator, wherein the lock indicator validates at least one of the forward and back indicators; and an output port to provide the forward and back indicators;

a delay line comprising:

a first input port to accept a source signal ($D_{ref}$);

a second input port to accept a delay line control signal wherein the delay line control signal adjusts a duration of the delay period ($\Delta t$); and an output port to provide the plurality of delayed clock signals;

wherein the delay line provides the subset of the plurality of delayed clock signals to the combinational logic;

a phase detector comprising:

a first input port to accept a source signal ($D_{ref}$);

a second input port to accept one of the plurality of delayed clock signals; and an output port to provide up and down indicators wherein the up indicator indicates the delay period ($\Delta t$) is longer than a desired delay period, and wherein the down indicator indicates the delay period ($\Delta t$) is shorter than a desired delay period;

charge pump logic comprising:

a first charge pump;

a second charge pump;

a first input port coupled to the output port of the combinational logic;

a second input port coupled to the output port of the phase detector; and a control signal wherein the control signal is adapted to adjust the delay period ($\Delta t$);

wherein an input port of the first charge pump is coupled to the output port of the combinational logic;

wherein an input port of the second charge pump is coupled to the output port of the phase detector; and wherein charge/discharge currents of the first charge pump is greater than charge/discharge currents of the second charge pump; and a filter comprising a capacitive element to hold the control signal from the charge pump logic.

19. The DLL of claim 18, further comprising:

variable rate selection logic comprising:

converter logic to convert a control signal from charge pump logic to a delay line control signal, wherein the converter logic has a plurality of conversion characteristics; and selection logic to provide the control signal operated on by a selected one of the plurality of conversion characteristics.

20. A method in a delay-locked loop (DLL) to produce a plurality of delayed clock signals wherein each pair of sequential clock signals forms a common delay period ($\Delta t$), the method comprising:

generating the plurality of delayed clock signals having a delay period ($\Delta t$), wherein a total count of the plurality of delayed clock signals comprises a total value N;

generating back and forward indicators based on a subset of the plurality of delayed clock signals, wherein a total count of signals in the subset comprises a total subset value of N−2 or fewer signals;

providing the back and forward indicators to charge pump logic; and generating a lock indicator based on the subset of the plurality of delayed clock signals.

21. The method of claim 20, further comprising determining the subset of the plurality of delayed clock signals.

22. The method of claim 21, wherein the determined subset of N−2 or fewer values comprises N/2 or fewer values.

23. The method of claim 20, further comprising:

selecting a conversion characteristic from a plurality of conversion characteristics;

converting a control signal from the charge pump logic to a delay line control signal based on the selected conversion characteristic; and providing the delay line control signal to a delay line.

24. The method of claim 20, wherein the subset excludes $\Phi_{n-1}$ and $\Phi_n$.

25. A method in a delay-locked loop (DLL) to produce a plurality of delayed clock signals wherein each pair of sequential clock signals forms a common delay period ($\Delta t$), the method comprising:

generating the plurality of delayed clock signals having a delay period ($\Delta t$), wherein a total count of the plurality of delayed clock signals comprises a total value N;

generating a lock indicator;

generating open-loop controls;

generating closed-loop controls;

while in an unlocked state, applying the open-loop controls to effect at least one charge pump; and while in a locked state, applying the closed-loop controls to effect the at least one charge pump.

26. The method of claim 25, wherein the act of generating the lock indicator comprises using false lock protection circuitry.

27. The method of claim 25, wherein the act of generating the lock indicator comprises determining the unlocked state based on the DLL converging on a delay period that is shorter than a minimum delay period.

28. The method of claim 25, wherein the act of generating the lock indicator comprises determining the unlocked state based on the DLL converging on a delay period that is longer than a maximum delay period.

29. The method of claim 25, wherein the act of generating the lock indicator comprises generating a lock indicator based on a subset of the plurality of delayed clock signals, wherein a total count of signals in the subset comprises a total subset value of N−2 or fewer signals.

30. The method of claim 25, wherein the act of generating the open-loop controls comprises generating open-loop controls in combinational logic based on a subset of the plurality of delayed clock signals, wherein a total count of signals in the subset comprises a total subset value of N−2 or fewer signals.

31. The method of claim 25, wherein the act of generating the closed-loop controls comprises generating closed-loop controls based on a phase difference from a phase detector.

32. The method of claim 31, wherein the phase difference comprises a phase difference between a reference signal and a feedback signal.

33. The method of claim 31, wherein the at least one charge pump comprises at least two charge pumps.

* * * * *